United States Patent
Marks et al.

(10) Patent No.: US 11,726,190 B2
(45) Date of Patent: Aug. 15, 2023

(54) SYSTEM FOR EMULATING AN ENVIRONMENT FOR TESTING A FREQUENCY MODULATED CONTINUOUS WAVE (FMCW) DETECTION AND RANGING (LIDAR) SYSTEM

(71) Applicant: NATIONAL INSTRUMENTS CORPORATION, Austin, TX (US)

(72) Inventors: Jason Marks, San Francisco, CA (US); Marcus Kieling daSilva, Leander, TX (US)

(73) Assignee: National Instruments Corporation, Austin, TX (US)

(*) Notice: Subject to any disclaimer, the term of this patent is extended or adjusted under 35 U.S.C. 154(b) by 259 days.

(21) Appl. No.: 17/315,063

(22) Filed: May 7, 2021

(65) Prior Publication Data
US 2021/0356571 A1  Nov. 18, 2021

Related U.S. Application Data

(60) Provisional application No. 63/023,984, filed on May 13, 2020.

(51) Int. Cl.
*G01S 7/497*  (2006.01)
*G01S 7/493*  (2006.01)
(Continued)

(52) U.S. Cl.
CPC .......... *G01S 7/497* (2013.01); *G01S 7/493* (2013.01); *G01S 7/4911* (2013.01); *G01S 17/10* (2013.01);
(Continued)

(58) Field of Classification Search
CPC ........ G01S 7/497; G01S 7/4911; G01S 7/493; G01S 17/10; G01S 17/34; G01S 17/931; G01S 17/894; G06F 30/20
See application file for complete search history.

(56) References Cited

U.S. PATENT DOCUMENTS 8,368,876 B1 * 2/2013 Johnson .................. G01S 17/89
356/3.01
10,491,885 B1  11/2019 Hicks
2019/0303759 A1  10/2019 Farabet et al.

FOREIGN PATENT DOCUMENTS

| CN | 104049259 B | 6/2017 |
| JP | 2018060512 A | 4/2018 |
| WO | 2006/035199 A1 | 4/2006 |

OTHER PUBLICATIONS

Jayaraman, et al., "Creating 3D Virtual Driving Environments for Simulation-Aided Development of Autonomous Driving and Active Safety", vol. 1, Mar. 2017, 6 pgs.

(Continued)

*Primary Examiner* — Hwa Andrew Lee
(74) *Attorney, Agent, or Firm* — Kowert, Hood, Munyon, Rankin & Goetzel, P.C.; Jeffrey C. Hood; Luke Langsjoen

(57) ABSTRACT

A system for emulating an over-the-air environment for testing a light detection and ranging (LiDAR) unit under test (UUT). The system may comprise a lens system that receives light from the LiDAR UUT and a plurality of optical processing chains. The system may generate light into free space based on the optical signals processed by each chain. The system may process received light optically to maintain coherence with light received from the LiDAR unit under test and may process all points in a LiDAR image simultaneously. The system may operate to emulate an over-the-air environment for a time-of-flight LiDAR UUT, a frequency modulated continuous wave LiDAR UUT, and/or a flash LiDAR UUT.

20 Claims, 18 Drawing Sheets

(51) Int. Cl.
*G06F 30/20* (2020.01)
*G01S 17/10* (2020.01)
*G01S 17/34* (2020.01)
*G01S 7/4911* (2020.01)
*G01S 17/931* (2020.01)

(52) U.S. Cl.
CPC .............. *G01S 17/34* (2020.01); *G06F 30/20* (2020.01); *G01S 17/931* (2020.01)

(56) References Cited

OTHER PUBLICATIONS

International Search Report and Written Opinion; Int'l Application No. PCT/US2021/031404; dated Aug. 18, 2021; 14 pgs.

* cited by examiner

SYSTEM FOR EMULATING AN ENVIRONMENT FOR TESTING A FREQUENCY MODULATED CONTINUOUS WAVE (FMCW) DETECTION AND RANGING (LIDAR) SYSTEM

PRIORITY CLAIM

This application claims benefit of priority to U.S. provisional patent Application No. 63/023,984 titled "System for Emulating an Environment for Testing a Light Detection and Ranging LiDAR System" and filed on May 13, 2020, whose inventors are Marcus daSilva, Amarpal Khanna, Jason Marks, and Douglas Farrell, which is hereby incorporated by reference in its entirety as though fully and completely set forth herein.

FIELD OF THE INVENTION

The present disclosure relates to the field of test, and more particularly to a system for emulating an over-the-air environment for testing a light detection and ranging (LiDAR) system.

DESCRIPTION OF THE RELATED ART

Light Detection and Ranging (LiDAR) is a method for detecting objects, targets, and even whole scenes by shining a light on a target and processing the light that is reflected. LiDAR is, in principle, very similar to radar. The difference is that LiDAR uses light with a wavelength outside the radio or microwave bands to probe the target. Typically, infrared light is used, but other frequencies are also possible. The much smaller wavelengths allow LiDAR to have better spatial resolution, allowing it to represent whole scenes as point clouds. Unlike a photographic image, which maps intensity and color onto 2 dimensions, each point in the LiDAR point cloud may additionally have an associated distance and/or velocity.

A typical LiDAR unit uses lasers to emit light. These emissions are scanned over the field of view and reflected by any objects in their path. The reflected light is received and processed by the LiDAR unit. Measurements (amplitude, delay, Doppler shift, etc.) of the received light as well as the scan angle ($\phi$, $\theta$) are aggregated, creating a physical description of the objects in the LiDAR's field of view. This method can represent a scene as a cloud of points as shown in FIG. 1. Each point in the cloud may have the following attributes:
  Horizontal angle or azimuth (typically denoted by $\phi$)
  Vertical angle or elevation (Typically denoted by $\theta$)
  Distance from the LiDAR unit. This is typically done by measuring the delay required for the light to make a round trip to the object and back.
  Speed relative to the LiDAR unit. This may be measured in two ways:
    Doppler shift of the reflected light.
    Computing the change in detected distance over successive distance measurements.
  Reflectivity. This is the fraction of the incident light that is reflected by the object, sometimes referred to as "intensity".

Developers and manufacturers of LiDAR units as well as the makers of the vehicles on which they will be mounted (cars, aircraft, etc.) often need to test the LiDAR under various conditions. Currently, as of 2020, developers and manufacturers resort to either: 1) testing in outdoor environments or 2) building a physical model of a real-world environment in a large area. While this can provide a well-defined test environment, it is large, expensive, difficult to automate and not scalable.

Therefore, improvements in the field are desirable.

SUMMARY OF THE INVENTION

Embodiments are presented herein of a system and method for performing LiDAR test and target emulation. More specifically, embodiments relate to a system for emulating an over-the-air environment for testing and/or calibrating a light detection and ranging (LiDAR) unit under test. The system may comprise an input lens system configured to receive light from the LiDAR unit under test (UUT), a plurality of optical processing chains coupled to the lens system, and an output lens system coupled to each of the optical processing chains. In some embodiments, a single lens system may function as both the input lens system and the output lens system. The output lens system is configured to generate light into free space and/or back to the LiDAR UUT based on the optical signals processed by each optical processing chain.

Each of the optical processing chains may comprise at least one optical fiber coupled to the input lens system and configured to provide optical signals corresponding to the received light. Each chain may also comprise a frequency shift emulator coupled to the plurality of optical fibers which is configured to create a frequency offset in the received optical signals. The frequency shift emulator may include an optical IQ modulator or an optical phase-locked loop. In some embodiments, the frequency shift emulator may use a different frequency shift for up-slope and down-slope to emulate both distance and Doppler shift. Each chain may further comprise a selectable optical delay device coupled to the frequency shift estimator and configured to selectively delay the optical signals to emulate a round-trip delay of reflected light. Finally, each chain may comprise at least one optical attenuator/amplifier configured to selectively control (attenuate or amplify) the amplitude of the optical signals to emulate different levels of reflectivity and path loss.

The system may be configured to process received light optically to maintain coherence with light received from the LiDAR unit under test. In some embodiments, the system may process all points in a LiDAR image simultaneously.

The system may also comprise a LiDAR image generator coupled to the frequency shift emulator, the selectable optical delay and the optical attenuator/amplifier, which may be user programmable to control operation of these devices. For example, the LiDAR image generator may be configured to provide a frequency shift value to the frequency shift emulator for use by the frequency shift emulator in creating a frequency offset in the received optical signals. The LiDAR image generator may also be configured to provide a delay value to the selectable optical delay for use by the selectable optical delay to delay the optical signals to emulate the round-trip time of the reflected light. Finally, the LiDAR image generator may be configured to provide an amplitude value to the optical attenuator/amplifier for use in controlling the amplitude of the optical signals to emulate different levels of reflectivity, polarization change, and path loss from free space, spectral components of the reflection, and/or diffuse components of the reflection. The LiDAR image generator may be configured to provide the frequency shift value, the delay value, and/or the amplitude value for each point in a point cloud generated by the system. The set of values provided by the LiDAR image generator may correspond to a particular test environment. In other words, the set of values may be pre-calculated to emulate a particular scene for testing the LiDAR UUT.

Embodiments may also relate to a system for emulating an over-the-air environment for testing a LiDAR UUT. The system may comprise an input lens system configured to receive light from the UUT. The system may further comprise an input optical splitting block coupled to the input lens system and configured to receive optical signals and provide portions of the optical signals to one or both of a first optical processing path and a second optical processing path. The system may also comprise at least one optical shutter array coupled to the first optical processing path and the second optical processing path.

The first optical processing path may comprise an array of photodetectors for determining angles of the laser pulse at a particular instant in time, wherein a location of received light on the photodetector array is used to open a corresponding element in the optical shutter array. A location of received light on the photodetector array may correspond to a vertical and horizontal scanning angle ($\phi,\theta$), wherein the vertical and horizontal scanning angle is used to open a corresponding element in the optical shutter array, or alternatively, a single lens system may be used to both receive the light from the LiDAR UUT and output the processed light back to the LiDAR UUT. In one embodiment, each photodetector in the array of photodetectors has a one-to-one mapping with a corresponding shutter in the optical shutter array. Alternatively, each of a plurality of sets of plural photodetectors in the array of photodetectors may have a many-to-one or a one-to-many mapping with a corresponding shutter in the optical shutter array.

The second optical processing path may comprise an amplitude controller to control the amplitude of the optical signals to emulate different levels of reflectivity, polarization change, and path loss from free space, spectral components of the reflection, and/or diffuse components of the reflection. The second path may also comprise a LiDAR image generator coupled to control the amplitude controller. The second optical processing path may be configured to provide an attenuated signal to the optical shutter array for exit through one or more open elements in the optical shutter array.

In some embodiments, the second optical processing path further comprises a frequency shifter coupled to the selectable optical delay element. The frequency shifter is configured to create a frequency offset in the received optical signals. Thus, in this embodiment the second optical processing path may provide a frequency shifted and attenuated signal to the output of the system. For example, the system may include an optical shutter array, and the processed signal may be provided for exit through one or more open elements in the optical shutter array. Alternatively, the system may utilize a lens system to both receive the light from the LiDAR UUT and output the processed light back to the LiDAR UUT. The frequency shifter may comprise an optical IQ modulator or an optical phase-locked loop.

In some embodiments, the second optical processing path may further comprise a selectable optical delay element coupled to the frequency shifter. The selectable optical delay element may be configured to selectively delay the optical signals to emulate a round-trip delay of reflected light. In this embodiment, the second optical processing path may be configured to provide a delayed and attenuated signal to the at least one optical shutter array for exit through one or more open elements in the optical shutter array. Alternatively, the system may utilize a lens system to both receive the light from the LiDAR UUT and output the delayed and attenuated signal back to the LiDAR UUT.

Other aspects of the present invention will become apparent with reference to the drawings and detailed description of the drawings that follow.

BRIEF DESCRIPTION OF THE DRAWINGS

A better understanding of the present invention can be obtained when the following detailed description of the preferred embodiment is considered in conjunction with the following drawings, in which.

Figure 1:
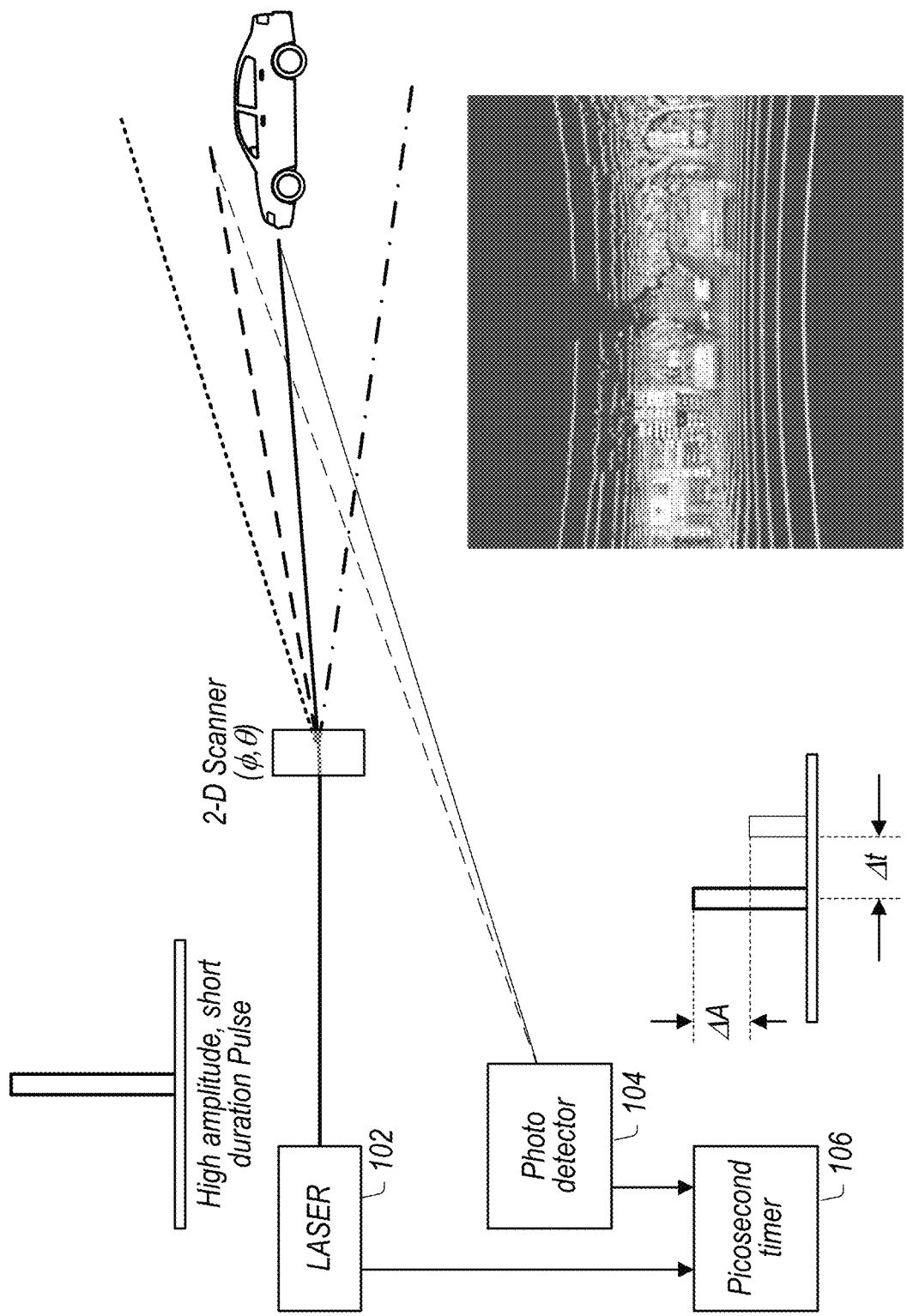
FIG. 1 shows pulsed time-of-flight (ToF) LiDAR operation, according to some embodiments.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE EMBODIMENTS

Terms

The following is a glossary of terms that may appear in the present disclosure:

Memory Medium—Any of various types of non-transitory memory devices or storage devices. The term "memory medium" is intended to include an installation medium, e.g., a CD-ROM, floppy disks, or tape device; a computer system memory or random access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. The memory medium may comprise other types of non-transitory memory as well or combinations thereof. In addition, the memory medium may be located in a first computer system in which the programs are executed, or may be located in a second different computer system which connects to the first computer system over a network, such as the Internet. In the latter instance, the second computer system may provide program instructions to the first computer system for execution. The term "memory medium" may include two or more memory mediums which may reside in different locations, e.g., in different computer systems that are connected over a network. The memory medium may store program instructions (e.g., embodied as computer programs) that may be executed by one or more processors.

Computer System (or Computer)—any of various types of computing or processing systems, including a personal computer system (PC), mainframe computer system, workstation, network appliance, Internet appliance, personal digital assistant (PDA), television system, grid computing system, or other device or combinations of devices. In general, the term "computer system" may be broadly defined to encompass any device (or combination of devices) having at least one processor that executes instructions from a memory medium.

Processing Element (or Processor)—refers to various elements or combinations of elements that are capable of performing a function in a device, e.g., in a user equipment device or in a cellular network device. Processing elements may include, for example: processors and associated memory, portions or circuits of individual processor cores, entire processor cores, processor arrays, circuits such as an ASIC (Application Specific Integrated Circuit), programmable hardware elements such as a field programmable gate array (FPGA), as well any of various combinations of the above.

Configured to—Various components may be described as "configured to" perform a task or tasks. In such contexts, "configured to" is a broad recitation generally meaning "having structure that" performs the task or tasks during operation. As such, the component can be configured to perform the task even when the component is not currently performing that task (e.g., a set of electrical conductors may be configured to electrically connect a module to another module, even when the two modules are not connected). In some contexts, "configured to" may be a broad recitation of structure generally meaning "having circuitry that" performs the task or tasks during operation. As such, the component can be configured to perform the task even when the component is not currently on. In general, the circuitry that forms the structure corresponding to "configured to" may include hardware circuits.

Various components may be described as performing a task or tasks, for convenience in the description. Such descriptions should be interpreted as including the phrase "configured to." Reciting a component that is configured to perform one or more tasks is expressly intended not to invoke 35 U.S.C. § 112, paragraph six, interpretation for that component.

Embodiments described herein relate to systems and methods for emulating the optical environment observed by a LiDAR. More specifically, embodiments described herein may provide developers and manufacturers of LiDAR units a means to emulate the optical environment observed by a LiDAR that is small, easy to replicate, and controllable by a computer.

There are three prevailing types of LiDAR commercially available or in development in 2020. Each comes with its own emulation challenges: 1) Pulsed Time-of-flight LiDARs (ToF); 2) LiDARS that use a series of linear FM Chirps, or Frequency Modulation Continuous Wave (FMCW); and 3) Flash LiDARs. Embodiments herein present systems and methods for emulating the optical environment for one or more of these types of LiDAR, or potentially for other types of LiDAR that may be developed in the future.

FIG. 1—ToF LiDAR Block Diagram

FIG. 1 shows a simplified schematic of a ToF LiDAR. The ToF LiDAR uses the following basic functional blocks to render a scene:

1). Pulsed laser: A ToF LiDAR emits a short-duration, high amplitude laser pulse. The amplitude may be high in order for the receiver to be able to capture pulses reflected from far away. This need for very strong light pulses is one of the drawbacks of the ToF LiDAR.

2). Scanner: The laser pulse passes through a scanner that varies the angle with which the light travels over the field of view. Successive laser pulses are scanned over the scene, covering the field of view. Some LiDARs use a single laser with a 2-dimensional raster scanner, while others may use a vertical array of lasers which are scanned horizontally (i.e., each laser scans in one dimension). Scanners may be mechanical with rotating mirrors and/or they may be implemented with an array of solid state lasers, with MEMS devices or optical phase arrays, among other possibilities.

3). Target objects in the field of view. The laser pulses reflect from target objects. The material, roughness and angle of the reflecting surface determines the reflectivity, or fraction of optical power, that is reflected. The LiDAR unit will receive a signal that is attenuated by the reflectivity, polarization change, and path loss from free space, spectral components of the reflection, and/or diffuse components of the reflection. This path loss may be determined by the distance as well as by any impairments such as dust, fog, etc. The reflection, as received by the LiDAR, will have a time delay. This delay is the time that light takes to make the round trip from the Lidar unit to the target and back. Velocity may be computed from the change in this distance over time from successive laser pulses. ToF LiDARs do not measure Doppler shift. The LiDAR unit has information about the angle ($\phi$, $\theta$) with which the light was transmitted from the scanner settings. The LiDAR uses this angle information to reconstruct the scene in its field of view.

4). Point Cloud. The scene is rendered as an array of points, each with the attributes of: i) The horizontal and vertical angles ($\phi$, $\theta$) of the illuminated point relative to the LiDAR; ii) The reflectivity at the point illuminated by the LiDAR; iii) The distance between the illuminated point and the LiDAR; and/or 4) The relative velocity of the of the point illuminated by the LiDAR. It is noted that in ToF LiDARs velocity is only measured indirectly. ToF LiDARs that are commercially available or in development as of April 2020 may render scenes as point clouds with 1,000 to 100,000 points.

FIG. 2: FMCW LiDAR

Figure 2:
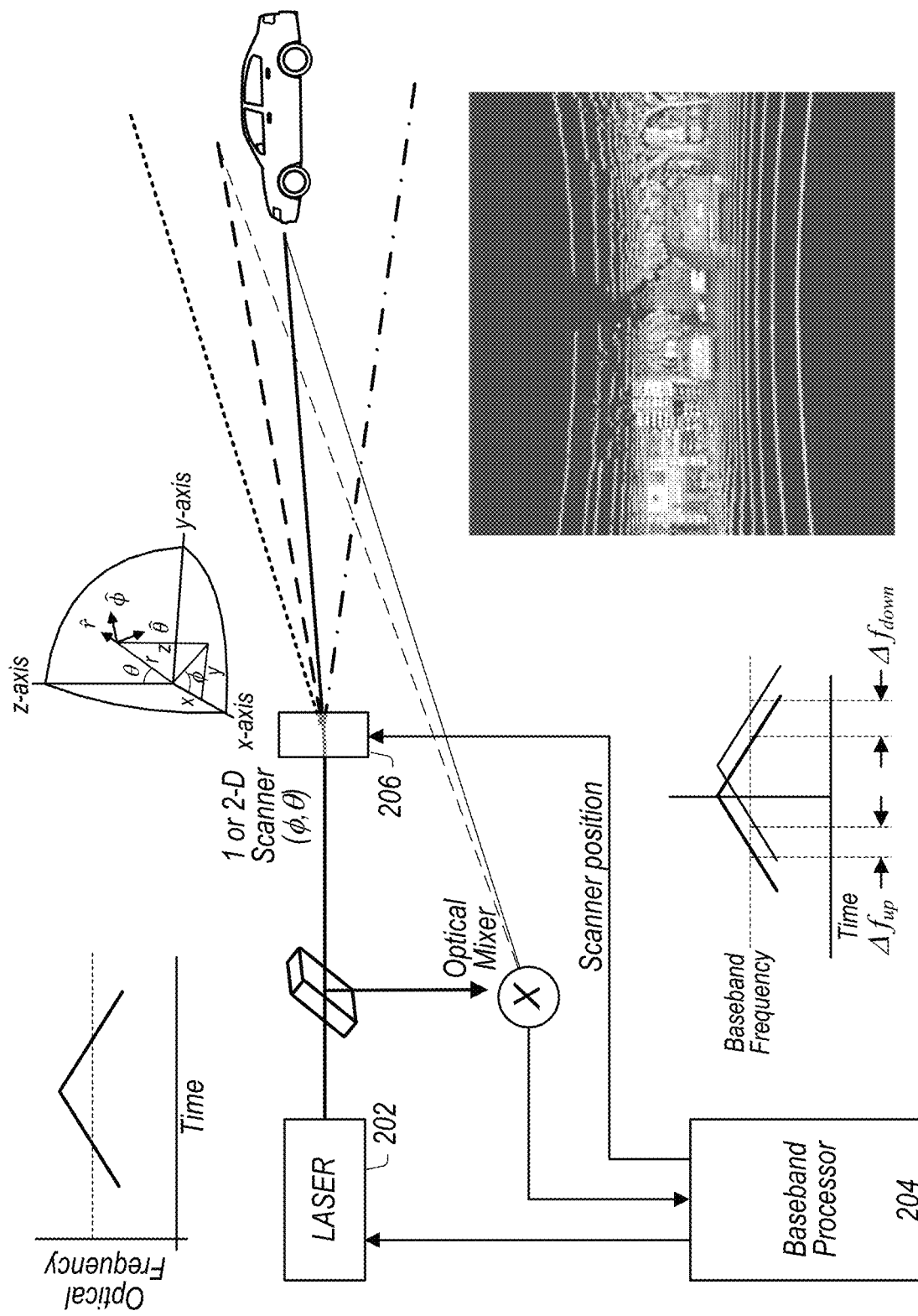
FIG. 2 is a block diagram of a frequency modulated continuous wave (FMCW) LiDAR system, according to some embodiments.

FIG. 2 shows a simplified schematic of a FMCW LiDAR system. FMCW LiDAR uses linear FM modulation of the laser light and synchronous processing at the receiver. Not only are FMCW LiDARs much more resistant to interference than their ToF counterparts, but they require much less peak optical power to have the same range and sensitivity. FMCW LiDAR typically uses an eye-safe wavelength to operate within, since the lasers are always on during operation.

The FMCW LiDAR may use the following basic functional blocks to render a scene:

1) FM Modulated laser source. The Laser in a FMCW LiDAR also produces light pulses. The pulses, however, are of longer duration and lower amplitude compared to those for ToF LiDARs and they are FM-modulated with a linear ramp or frequency sweep. Many FMCW LiDARs use a combination of linear up-ramp and a linear down-ramp in the frequency sweep. The linear frequency sweeps allow several signal processing advantages over ToF LiDARs, as explained in greater detail below.

2). Linear frequency sweep processing. The linear frequency sweep means that the actual frequency of the laser changes linearly in time. The laser is reflected by a target object and experiences a round-trip time delay. This time delay means that the frequency of the received signal is the same as the frequency that was transmitted at an earlier time, before the time delay. The received signal is mixed with the transmitted signal and the resulting baseband signal is processed electronically. Up-sweep refers to where the received frequency is lower than the transmitted frequency for a stationary object. Down-sweep refers to where the received frequency is higher than the transmitted frequency for a stationary object. If the target object is moving relative to the LiDAR unit then the received signal also experiences a frequency shift due to the Doppler effect, which is independent of sweep direction. The effects of transit delay and the Doppler shift can be separated by processing the up and down sweeps together. The frequency shift in the up-sweep contains the effect of Doppler minus the effect of the delay. The frequency shift in the down-sweep contains the effect of Doppler plus the effect of delay.

$$\frac{\Delta f_{up} + \Delta f_{down}}{2} = \Delta_{Doppler}$$

$$\frac{\Delta f_{up} + \Delta f_{down}}{2} = \Delta_{transit}$$

Accordingly, the effect of the Doppler shift may be separated from the effect of the round-trip time delay, such that the FMCW LiDAR system may calculate both the velocity of and the distance to the reflective point in the scene.

Figure 3:
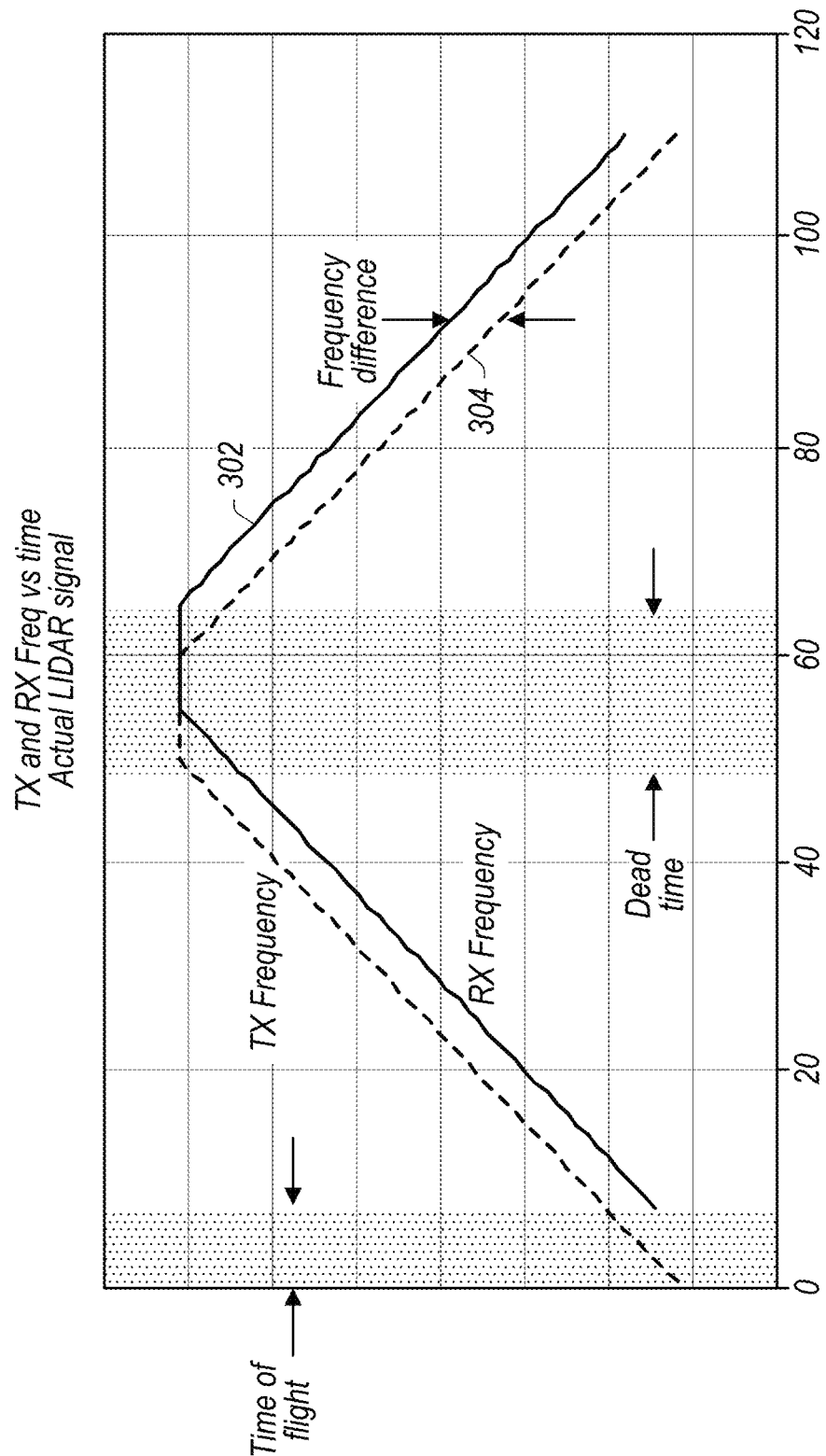
FIG. 3 shows an up-down linear frequency modulation (FM) ramp, according to some embodiments.

FIG. 3: Up-Down Linear FM Ramp

FIG. 3 shows a graph of the transmit (TX) and receive (RX) frequency vs. time of an actual LiDAR signal. The frequency may be modulated with a linear ramp. Each chirp ramp (i.e., the up-ramp and the down-ramp) may have a time duration longer than the maximum round trip delay. The received signal may be a delayed version of the transmitted signal. In the up-ramp, the delay causes the RX frequency to be lower than the TX frequency. In the down ramp, the delay causes the RX frequency to be higher than the TX frequency. Speed may also cause a frequency shift due to the Doppler effect. For example, frequency shifts up when the target is approaching and frequency shifts lower when the target is receding.

Both transit time and the Doppler effect may create a frequency shift. This frequency shift is recovered when the received light pulse is mixed with the transmitted light pulse.

$$\text{Up-Chirp: } \Delta f_{up} = \Delta_{Doppler} - \Delta_{transit}$$

$$\text{Down-Chirp: } \Delta f_{down} = \Delta_{Doppler} + \Delta_{transit}$$

$$\frac{\Delta f_{up} + \Delta f_{down}}{2} = \Delta_{Doppler}$$

$$\frac{\Delta f_{up} + \Delta f_{down}}{2} = \Delta_{transit}$$

There may be a dead time at the beginning of each up or down ramp while the light travels to the target and back.

The scanner may operate as follows. The laser pulse may pass through a scanner that may vary the angle with which the light travels over the field of view. Successive laser pulses may be scanned over the scene, covering the field of view. Some LiDARs may use a single laser with a 2-dimensional scanner, while others may use a vertical array of lasers which are scanned horizontally (or a horizontal array of lasers which are scanned vertically). Scanners may be mechanical, with rotating mirrors or solid state. Target objects in the field of view may affect the system as follows. The laser pulses reflect from target objects, where the material, roughness and/or angle of the reflecting surface determines the reflectivity, or what fraction of the light is reflected. The LiDAR unit may receive a signal that is attenuated by the reflectivity, polarization change, and path loss from free space, spectral components of the reflection, and/or diffuse components of the reflection. This path loss may be determined by the distance as well as by any impairments such as dust, fog, etc. The reflection, as received by the LiDAR will have a time delay. This delay is the time that light takes to make the round trip from the Lidar unit to the target and back. The time delay may manifest itself as a frequency shift of the RX frequency relative to the TX frequency. This shift is negative for up-sweeps and positive for down sweeps. The reflection may also have a Doppler shift which is proportional to the velocity difference between the LiDAR unit and the target object. The Doppler shift may not be dependent on the sweep direction. The LiDAR unit has information about the angles ($\phi$, $\theta$) with which the light was transmitted from the scanner settings. The LiDAR uses this angle information to reconstruct the scene in its field of view.

The synchronous receiver may operate as follows. The LiDAR receiver combines the reflected pulse and the transmitted pulse. The result is a signal that may be used to determine the frequency difference between the transmitted and received light at a given instant in time. This low-frequency signal (typically in the MHz range) is processed using conventional RF signal processing techniques. The ability to process the received signal electronically, with a much lower bandwidth, may provide a large improvement in the achievable signal-to-noise ratio (SNR). This may allow distant objects to be imaged with much lower transmit laser power than what is required with a ToF LiDAR. The relative velocity of the target object may be measured directly through the Doppler shift.

Point Cloud. The scene may be rendered as an array of points, each with the attributes of: 1) The horizontal and vertical angles ($\phi$, $\theta$); 2). The reflectivity of the at the point illuminated by the LiDAR; 3) The distance between the illuminated point and the LiDAR; and 4) The relative velocity of the of the point illuminated by the LiDAR.

FMCW LiDARs in development as of April 2020 can render scenes as clouds with 1000 to 100000 points.

Flash LiDAR

Flash LiDAR is a specific type of LiDAR, as opposed to Scanned Pulsed Time of Flight ("ToF") and Frequency Modulated Continuous Wave ("FMCW") LiDAR types. Flash LiDAR devices are currently commercially available, and the technology is continuously improving. Some embodiments herein address the challenge of testing Flash LiDAR devices through a methodology that allows for a LiDAR device to be coupled to a system that emulates a 3D world environment. This process works by emulating a response that a Flash LiDAR would receive in a driving scenario or other contrived scenario through a combination of optical and electrical technology. The response that the LiDAR receives will then create a "point cloud," which is the standard output for a Flash LiDAR device, that will be substantially similar to the point cloud that would be created in a real driving or other scenario. Because the Flash LiDAR optical output is not physically connected to the emulation system, the emulation will occur optically "over the air," or within free space. This methodology will enable the test of Flash LiDAR in a cost effective, efficient, and highly repeatable way.

Figure 4A:
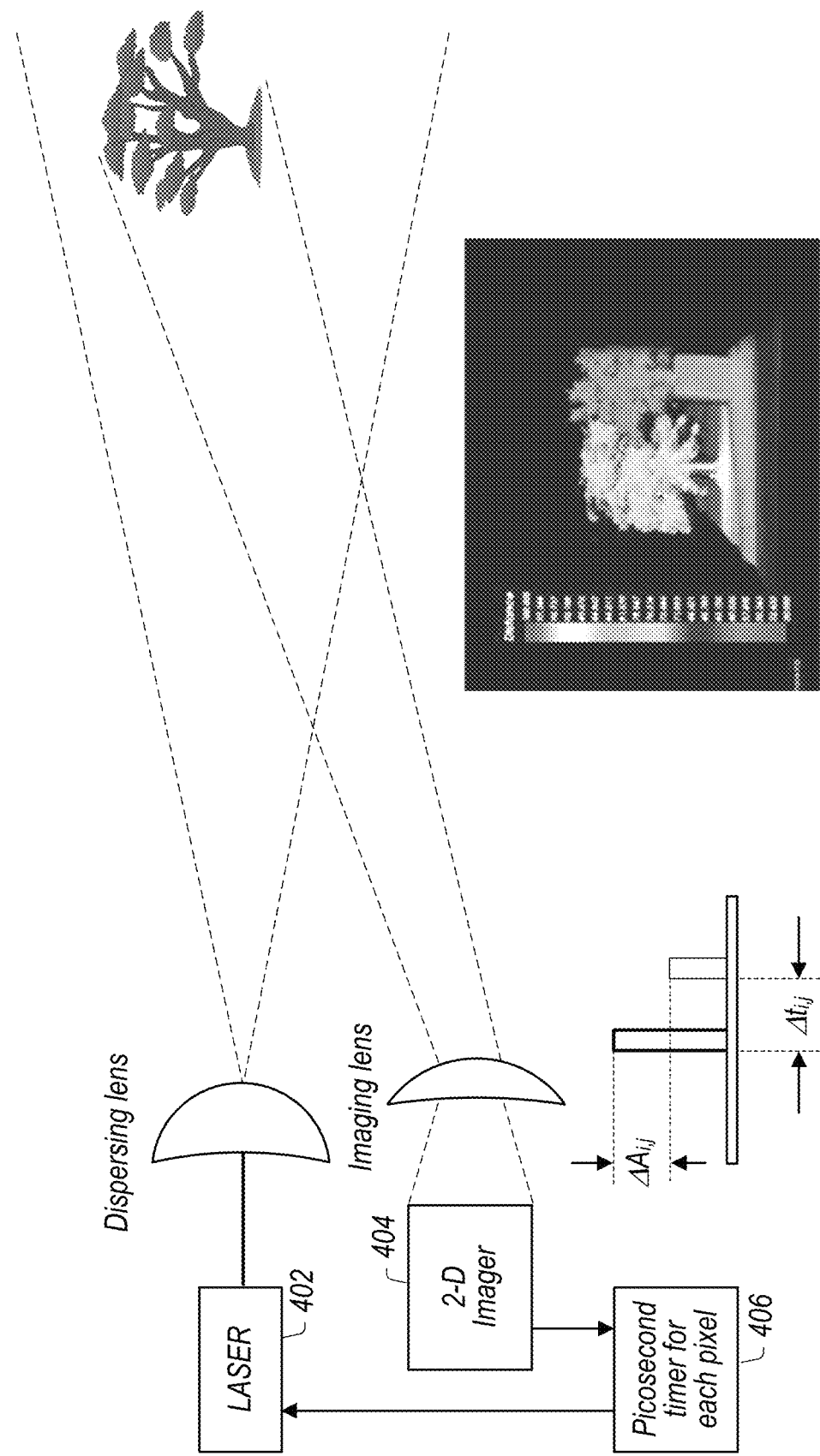
FIG. 4A shows single-flash LiDAR operation, according to some embodiments.

FIG. 4A illustrates a simplified schematic of a Flash LiDAR device with a single laser source. Flash LiDAR, as the name implies, behaves much like the familiar flash camera. The entire scene is flooded with light. The Flash LiDAR differs from others in the following ways. First, there is often no scanner associated with the transmitted light pulses. For a single laser Flash LiDAR, the light from a single laser pulse is spread over the entire field of view with a system of lenses or a diffuser. For some flash LiDAR devices, scanning systems may be utilized, though they still differ from ToF and FMCW scanned systems in that they are "flashing" a subsection of the field of view at a time and that subsection is moved over time. Target objects reflect the flash of light. Unlike the point-by-point illumination of other types of LiDAR, the entire scene (or a subsection of the scene) is illuminated at once, by flashing a short laser pulse and using a diffuser to spread the light. Second, the reflected light is captured by a lens and projected onto an imager much like an electronic camera. Third, the imager, composed of thousands of pixels, processes each pixel using ToF, FMCW or other techniques to render an image.

Figure 4B:
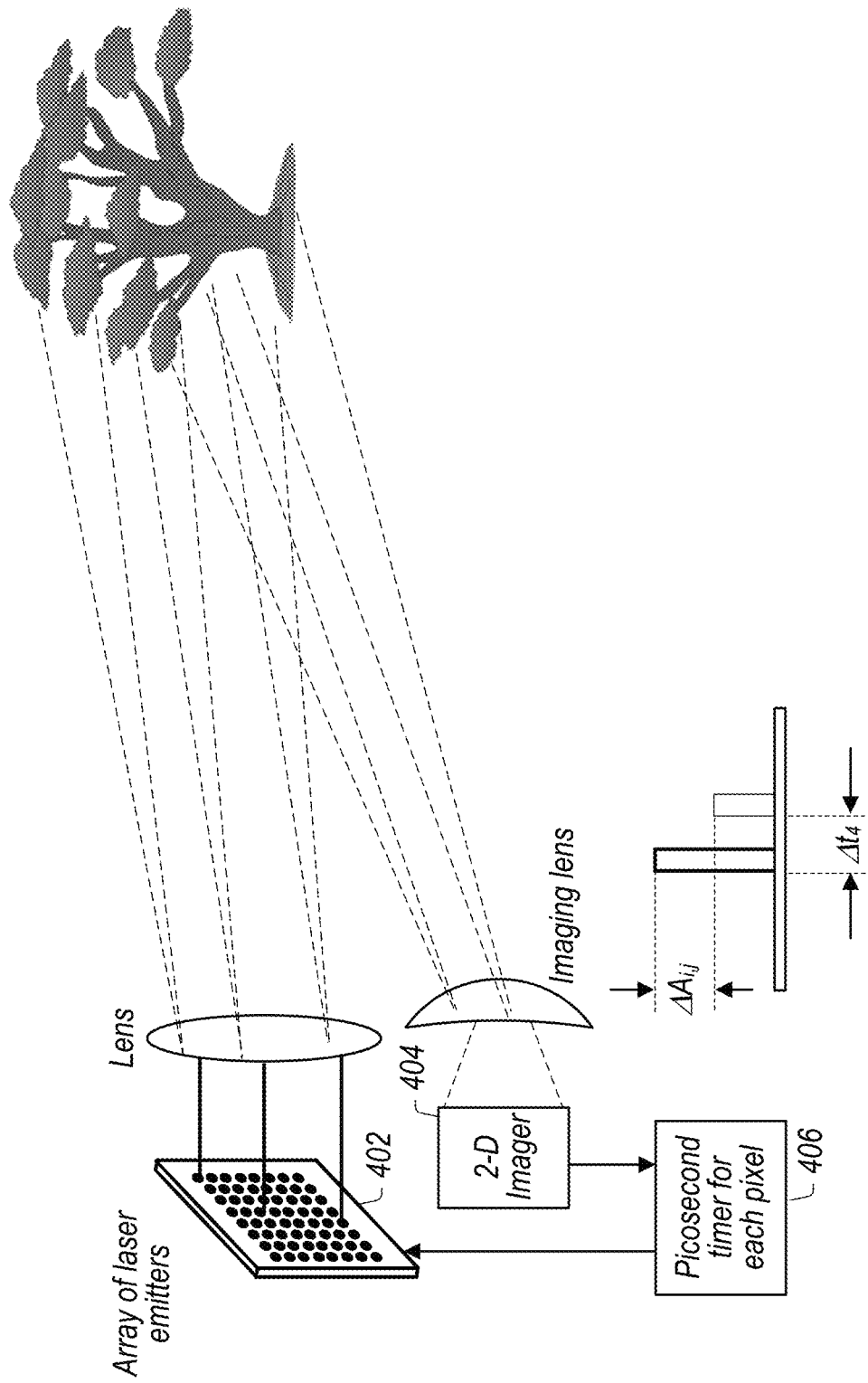
FIG. 4B shows multi-flash LiDAR operation, according to some embodiments.

FIG. 4B shows a simplified schematic of a multi-beam flash LiDAR. Multi-beam flash LiDAR is similar to single-beam flash LiDAR, but differs from single-beam flash LiDAR in that more than one laser (e.g., potentially an array of lasers) is used on the transmitting side of the LiDAR. Each laser in the array illuminates a small part of the target area, and firing of the lasers is individually controlled. In some embodiments, a few lasers may be fired at a time, and a full image is built up once all lasers have fired. In some embodiments, firing may be foveated with higher frequency firing in regions deemed more important. Advantageously, the range limitations of flash LiDAR may be mitigated by multi-beam flash LiDAR, as it reduces the power required for the lasers because each laser illuminates a small area.

Some embodiments herein describe over-the-air environment emulator systems to operate with single and/or multi-beam flash LiDAR devices.

LiDAR Scene Emulation Challenges

The job of a LiDAR scene emulator is to create an emulated over-the-air environment that is, to the LiDAR under test (LUT), indistinguishable from an actual scene. Additionally, it is desirable for the scene emulator to be small, inexpensive and programmatically controlled, allowing for the emulation of many moving objects, impairments (sunlight, dust, snow, other LiDARs, etc), and environments. Some attributes of a LiDAR emulator include:

1) The Field of view (FOV), i.e., the horizontal and vertical ($\phi$, $\theta$) angle over which a LiDAR creates an image. The symbol $\phi$ represents the horizontal angle range, which may range from 30 to 360 degrees for Automotive LiDAR applications. The symbol $\theta$ represents the vertical angle, which may vary in various ranges, e.g., from −10 to +80 degrees, from 10 to 90 degrees, etc., for automotive LiDAR applications. An emulator may create scenes covering all or a part of the FOV.

2). The Angular resolution, which is the is the smallest angle that a LiDAR can detect. The vertical and horizontal angular resolutions may be of the order of 0.1 degrees, as one example.

3). Number of points in the point cloud. Automotive LiDARs typically depict scenes with 1,000 to over 1,000,000 points, although other numbers of points are also possible.

4). Minimum/maximum distance. Automotive LiDARs may function for distances of 1 m to about 300 m, among other possibilities.

Minimum/maximum velocity of emulated objects. Automotive LiDARs may measure speeds ranging from 0 to 500 km/hour.

5). Interference generation, such as noise, dust, rain, sunlight, other lidars, etc.

6). Scene dynamics. The ability to change a scene from frame to frame. LiDARs may have frame rates of 10 to 100 frames per second.

7) LiDAR Types. The phrase "LiDAR Types" refers to the type of LiDAR that the system can emulate. Currently, commercial emulators exist for ToF LiDARs. FMCW and flash LiDARs are now under development in 2021. There is an industry demand for a programmable emulator that works with FMCW LiDARs.

8) Emulator Size. Automotive LiDARs are designed to see a large field of view over distances as large as 300 meters. Other LiDAR applications may reach even farther. The ideal emulator occupies a small fraction of this space, allowing it to be placed on a bench, factory floor, or on a production line.

9). Point cloud emulation. LiDARs may render a scene with 1000 to 100000 points. Each point in the point cloud has the azimuth and elevation angles, reflectivity, distance and Doppler shift. Scanning LiDARs may take advantage of sequential nature of a scan to time share the electronic and optical processing elements.

10). Flash LiDARs flood all points in a scene with light simultaneously. Optical processing is done in parallel. Like camera imagers, the imager in a Flash LiDAR receiver may use a scanning process internally. Unlike the TOF and FMCW systems that use laser scanning for transmission, there is no way to know the state of the scanner from observations of the external laser pattern. Knowledge of this internal scan, if available, may be used to share optical and electrical signal processing components in an emulator.

Commercially available automotive LiDAR emulators currently in existence are designed for scanned pulsed ToF Lidars, and cannot be used with Flash or FMCW types. These emulators work using the approach illustrated in FIG. 5. Embodiments herein improve on these LiDAR emulators by providing systems and methods for LiDAR emulation that may be used with FMCW and/or Flash LiDAR systems.

Figure 5:
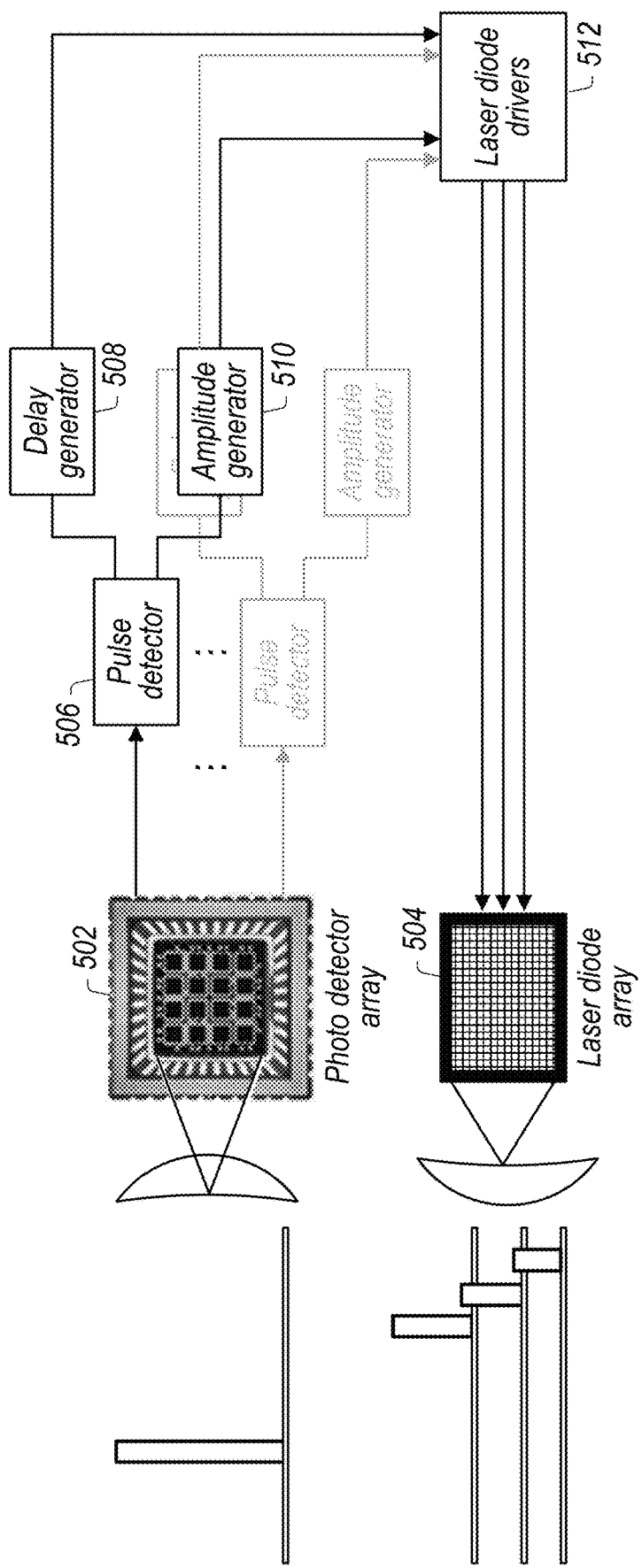
FIG. 5 illustrates a block diagram of a ToF LiDAR target emulator, according to some embodiments.

FIG. 5: Scanned ToF LiDAR Target Emulator Block Diagram

FIG. 5 is a block description of a prior art ToF target emulator. An array of photodetectors in conjunction with a system of lenses or mirrors is used to detect a light pulse from the LiDAR UUT. Each location on the photodetector array (i.e., each pixel) corresponds to a distinct vertical and horizontal scanning angle ($\phi$, $\theta$). An alternative method is to ignore the transmitted laser and use a signal from the LiDAR unit to determine the state of the scanner and the timing of the laser pulse. Each photodetector in the photodetector array is connected to a pulse generator. The rising edge from the photodetector triggers the pulse. An image processor is programmed to assign an amplitude and a delay value to each pixel. The delay and amplitude values are fed to a delay generator and amplitude controller. The delayed and amplitude-scaled pulses are fed to an array of laser diodes. These generate a pulse of light that has been scaled and delayed. The array of laser diodes can have a one-to-one correspondence with the photodetector array. The number of laser diodes may not need to have a one-to one correspondence with the photodetector array. The UUT has knowledge of angles through which the original pulse was sent and may not need a full resolution laser diode array to reconstruct a scene. An important distinction between the LiDAR emulator shown in FIG. 5 and some embodiments described herein is that the emulator in FIG. 5 creates new light pulses responsive to receiving light pulses from the LiDAR UUT, whereas LiDAR emulators based on some embodiments described herein modulate the received light pulses and return them to the LiDAR UUT.

Emulation System Embodiments

The novel emulator described herein may have various embodiments. In some embodiments, the emulator described herein may provide LiDAR scene emulation for more than one type of LiDAR, including all three of ToF, FMCW and Flash. This method, while plausible, may be too complex and expensive for practical implementation using currently available technology. Technology advances may make this approach feasible in the future. A second embodiment may be a less complex concept for LiDAR scene emulation that may be used for both ToF and FMCW LiDARs. Other embodiments may be a version that may be used for only one of ToF LiDARs, FMCW LiDARs, or Flash LiDARs.

The following description begins with the most general, complex and expensive implementation. Simplifications that are made possible due to the properties of ToF and FMCW LiDARs are described further below.

Figure 6:
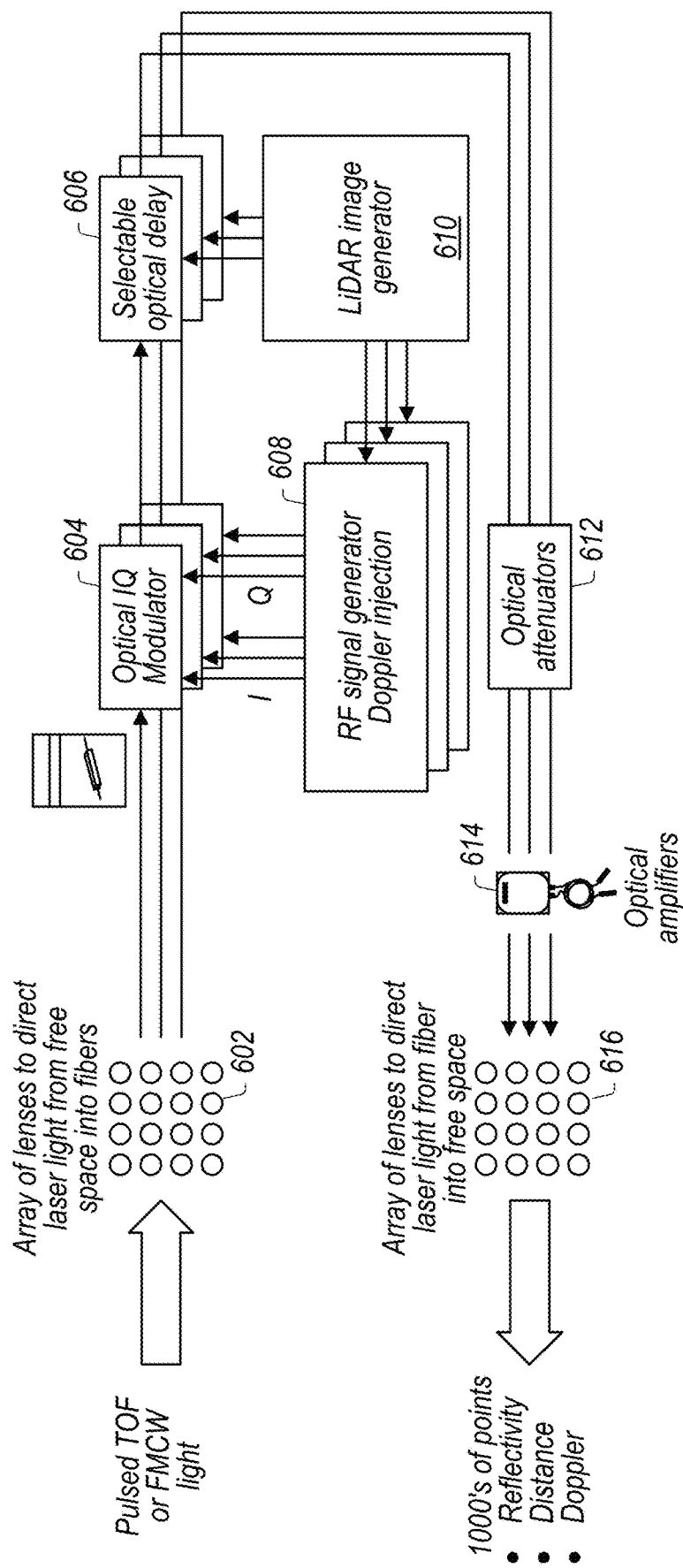
FIG. 6 illustrates a LiDAR scene emulator that can work for ToF, FMCW, and flash LiDARs, according to some embodiments.

FIG. 6—Parallel Point Cloud Emulator—LiDAR Scene Emulator

FIG. 6 is a conceptual block diagram of a LiDAR target emulator that is agnostic to LiDAR type. In other words, FIG. 6 illustrates a parallel point cloud emulator-LiDAR scene emulator that may work for ToF, FMCW and Flash LiDAR UUTs. This emulator embodiment can process all points in a LiDAR image simultaneously. This emulator embodiment may also process the laser light optically, maintaining coherence with the original signal transmitted by the LiDAR UUT. This coherence may be useful for FMCW processing.

The following provides Parallel Point cloud emulator block descriptions:

The input optical processing block may contain an array of lenses capable of guiding each point in the LiDAR cloud into a corresponding optical fiber, each connected to an optical processing chain. There is mapping of optical fiber and processing chains to each point in the cloud. Some embodiments may employ direct mapping where a LiDAR that renders scenes with 1000 points would require 1000 optical processing chains, one per point. Other embodiments may employ indirect mapping where multiple points may map into each optical processing chain.

Each optical processing chain may contain a frequency shift emulator, which may also be referred to as a Doppler shift emulator. The Doppler shift emulator creates a frequency offset in the light conducted by the fiber. This can be done in several ways as shown in the block diagrams shown in FIG. 7.

Figure 7:
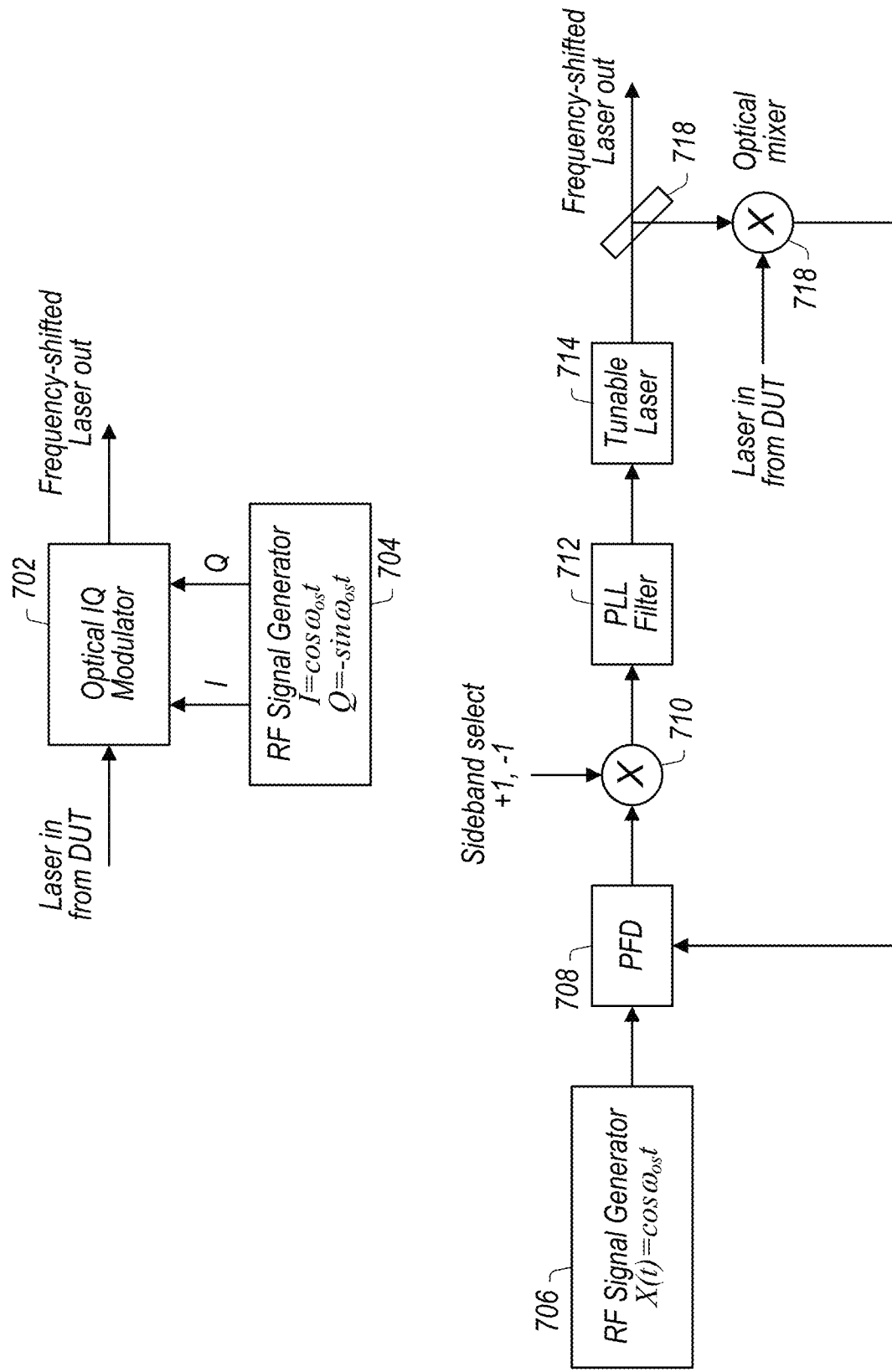
FIG. 7 illustrates block diagrams of systems for creating an optical frequency shift, according to some embodiments.

Optical in-phase quadrature (IQ) modulator. An IQ modulator can be used to shift the frequency of an incoming signal. Optical IQ modulators have optical bandwidths in the range of 10's of GHz and optical local oscillator (LO) inputs in the optical wavelengths used by LiDARs. An RF signal generator can be used to generate a sine wave and a cosine wave at the same frequency. The cosine wave is fed to the I input and the sine wave to the Q input of the IQ modulator, such that I=Cos ($\omega$t) and Q=−sin ($\omega$t). The optical signal at the output of the IQ modulator will be shifted by the angular frequency $\omega$. The frequency $\omega$ may be chosen to correspond to the Doppler shift for the point being emulated. An alternative to the optical IQ modulator is to use an optical Phase-locked-loop (PLL) to provide the frequency shift as seen in FIG. 7. More particularly, FIG. 7 illustrates methods for creating an optical frequency shift, including either an optical IQ modulator or an optical PLL. It is noted that ToF LiDARs cannot detect Doppler shift, and this block may not be used for ToF LiDAR emulators.

Each optical processing chain may also contain a selectable optical delay. The selectable optical delay may operate to delay the optical pulse to emulate the round-trip delay of the reflected laser light. This may be implemented as a switchable segment of binary weighted delays. Time segments such as 2, 4, 8, 16, 32, 64, 128, 256, and 512 ns segments can emulate round trip delays corresponding to, e.g., 30 cm to 76.8 m. The delays are often implemented as selectable lengths of optical fiber.

Each optical processing chain may also contain optical attenuators and amplifiers: These provide a means of controlling the amplitude of the optical signals to emulate different levels of reflectivity, polarization change, and path loss from free space, spectral components of the reflection, and/or diffuse components of the reflection. The light traveling through each of the optical fibers can selectively be attenuated or amplified to ensure that the light intensity received by the LiDAR corresponds to the reflectivity and path loss at the location on the object being emulated.

This method has numerous advantages, such as that it works for all types of LiDAR, independent of scanning method, modulation or imaging approach. Also, this method truly emulates the behavior of real objects. Disadvantages of this method include complexity, size and power, which may render this method impractical for more point clouds with many points. Further, this method may use an RF generator, IQ modulator, and selectable optical delay for each point in the cloud. These are expensive and large, as clouds can have up to 100,000 points, and hence costs can run into the $10s of millions at the present time. It is noted that advances in technology (photonic ICs, multilane parallel fibers . . . ) will likely make this more economically feasible in the future.

Figure 8A:
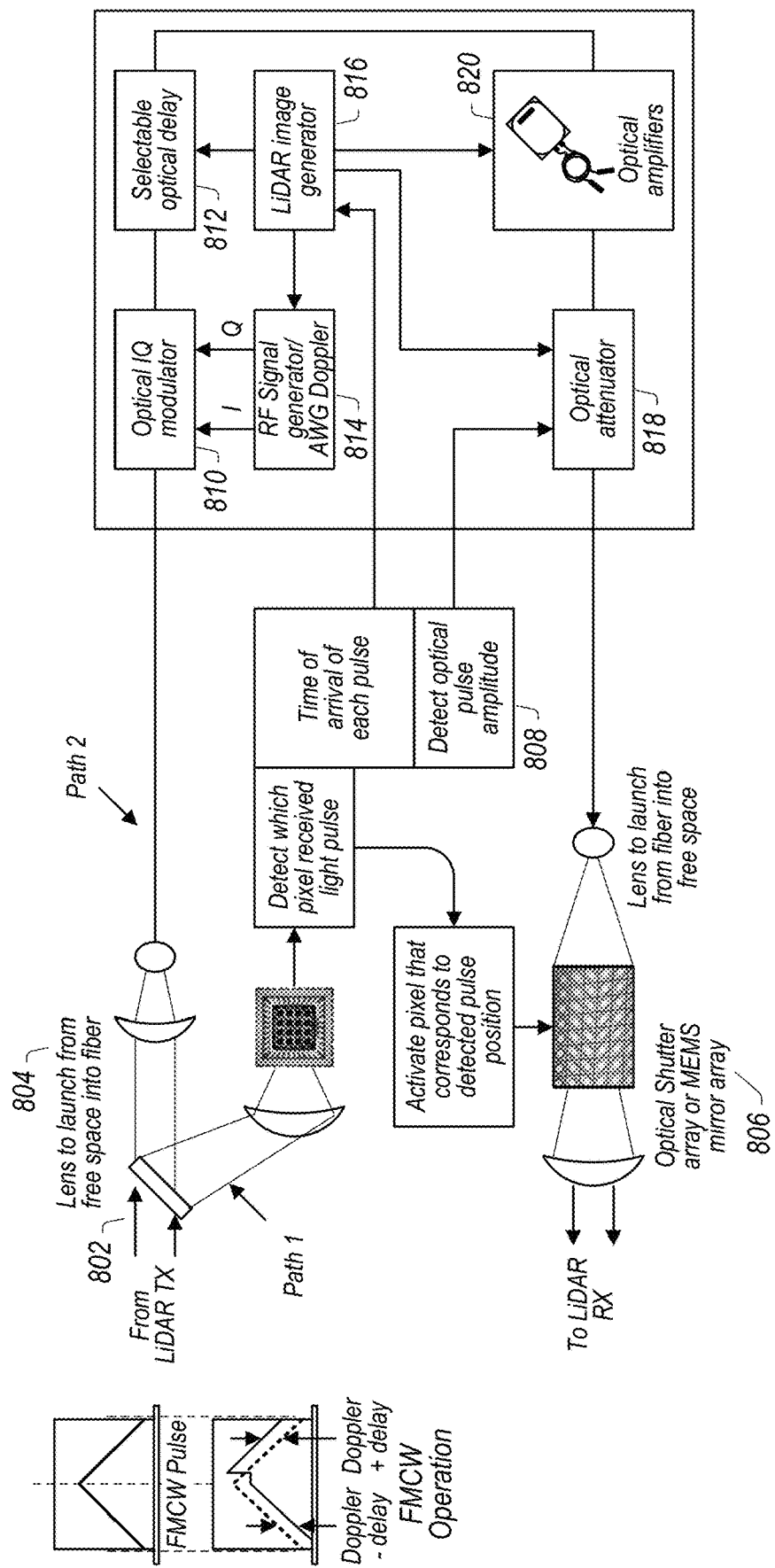
FIG. 8A is a block diagram of a LiDAR scene emulator for ToF and FMCW LiDARs including an optical shutter array, according to some embodiments.
Figure 8B:
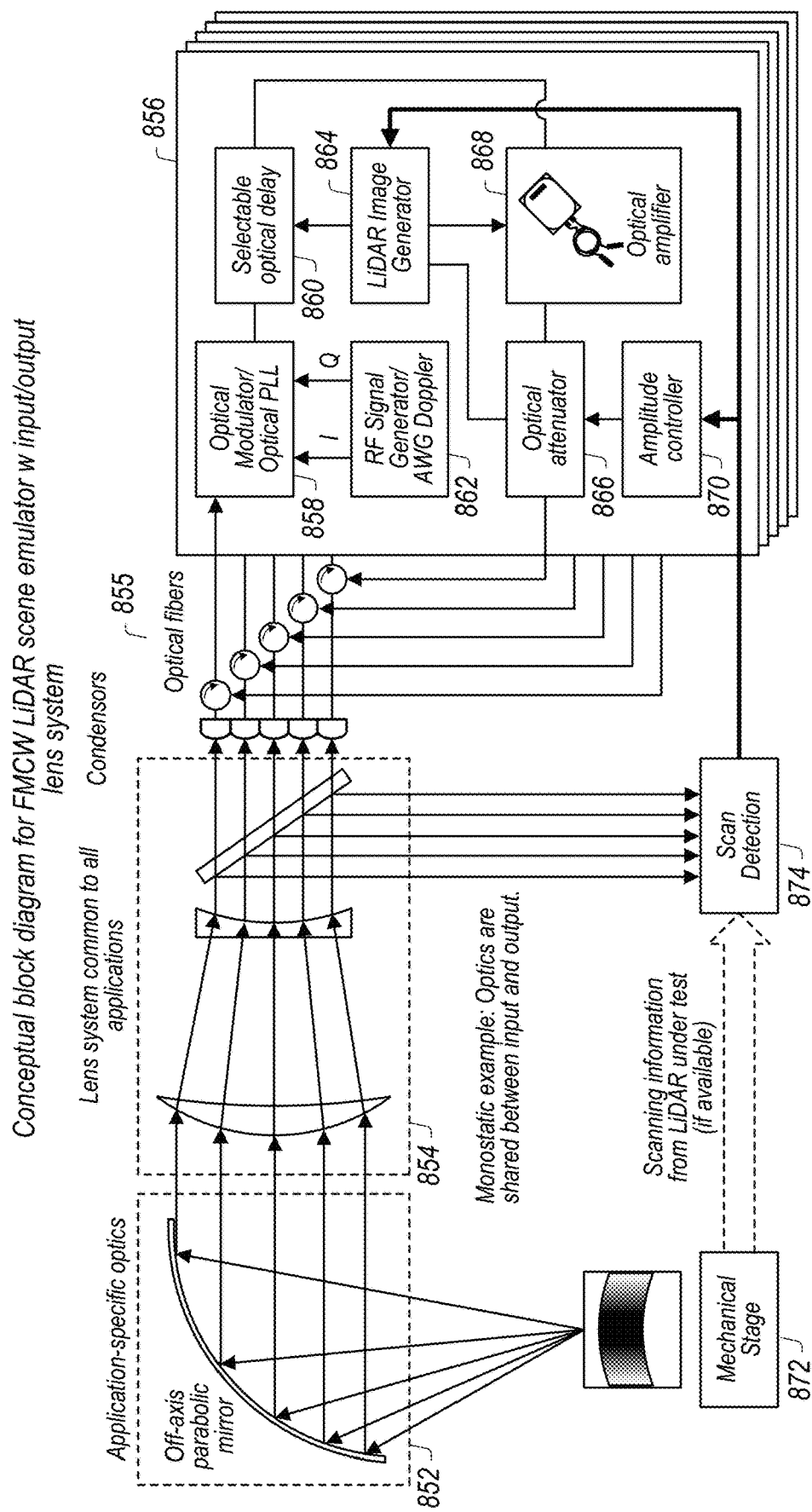
FIG. 8B is a block diagram of a LiDAR scene emulator for ToF and FMCW LiDARs including an input/output lens system, according to some embodiments.

FIGS. 8A-B: Emulator System for Pulsed ToF and FMCW LiDARs.

FIGS. 8A and 8B illustrate two LiDAR scene emulators that may work for both FMCW and ToF LiDAR UUTs, according to some embodiments. More particularly, FIG. 8A illustrates a point cloud emulator for scanned, pulsed systems, e.g., a LiDAR scene emulator for ToF and FMCW LiDARs. This system uses the fact that the laser is scanned and that laser pulses do not arrive at all points in a point cloud simultaneously. This allows the expensive optical and electronic signal processing blocks to be time-shared. The light pulses from the LiDAR under test are processed optically, maintaining the coherence needed by FMCW LiDARs.

FIG. 8A illustrates a schematic block diagram for a LiDAR scene emulator capable of FMCW and ToF LiDAR scene emulation. The system may include an input optical splitting block 802 that takes a portion of the incoming optical signal and splits it into two paths. Path 1 is fed to an array of photodetectors for determining the angles (φ, θ) of the laser pulse at a particular instant in time. Path 2 is fed to a lens system 804 that focuses all the light into a small number of optical fibers, each feeding an optical processing chain. LiDARs that have a single laser and a two-dimensional scan may use a single optical processing chain. LiDARs that have multiple lasers and a one-dimensional scan may use one optical processing chain for each laser in the LiDAR under test. For example, a LiDAR with a vertical stack of 16 lasers may use 16 optical processing chains.

Figure 9A:
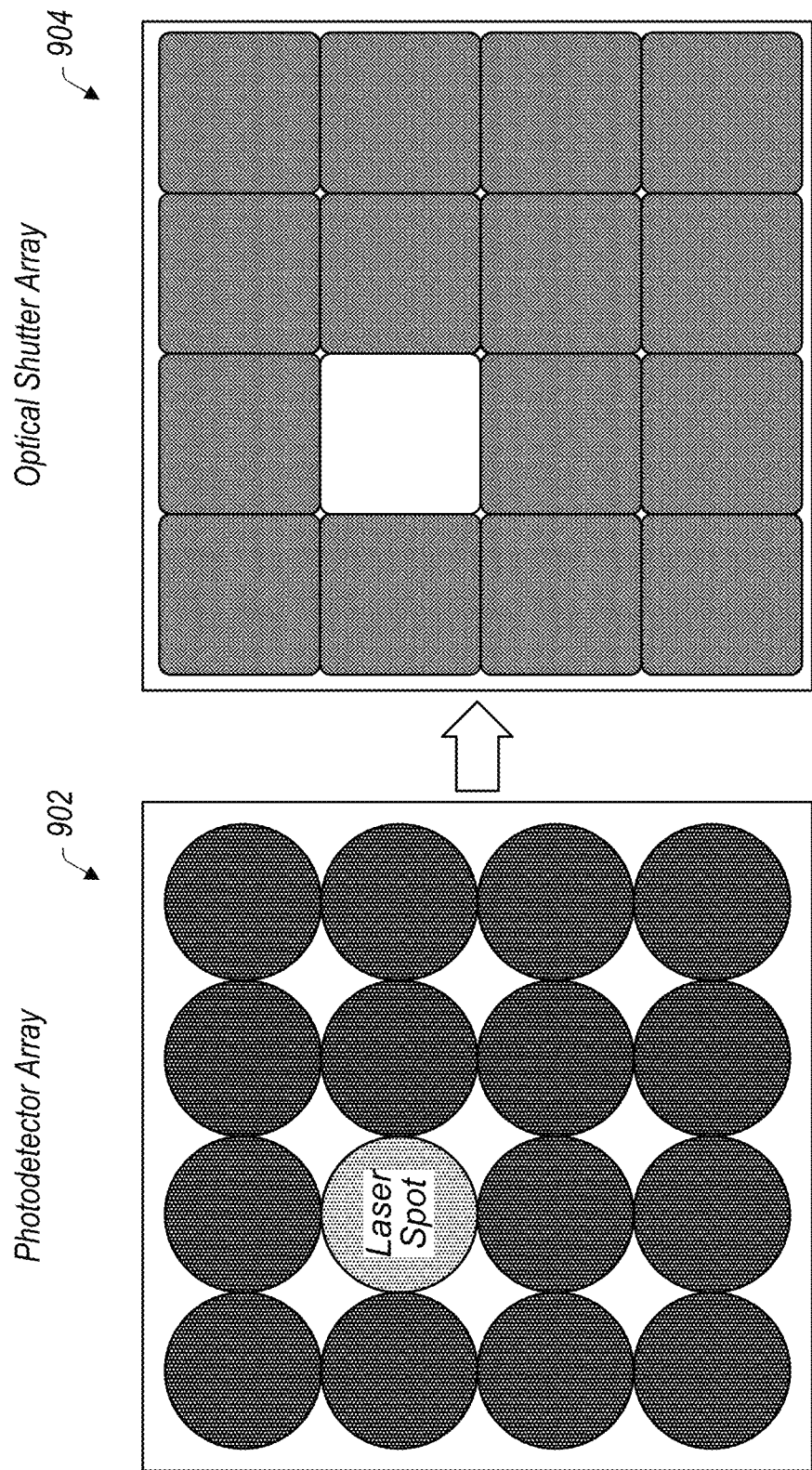
FIG. 9A illustrates one-to-one mapping between a photodetector array and an optical shutter array according to some embodiments.
Figure 9B:
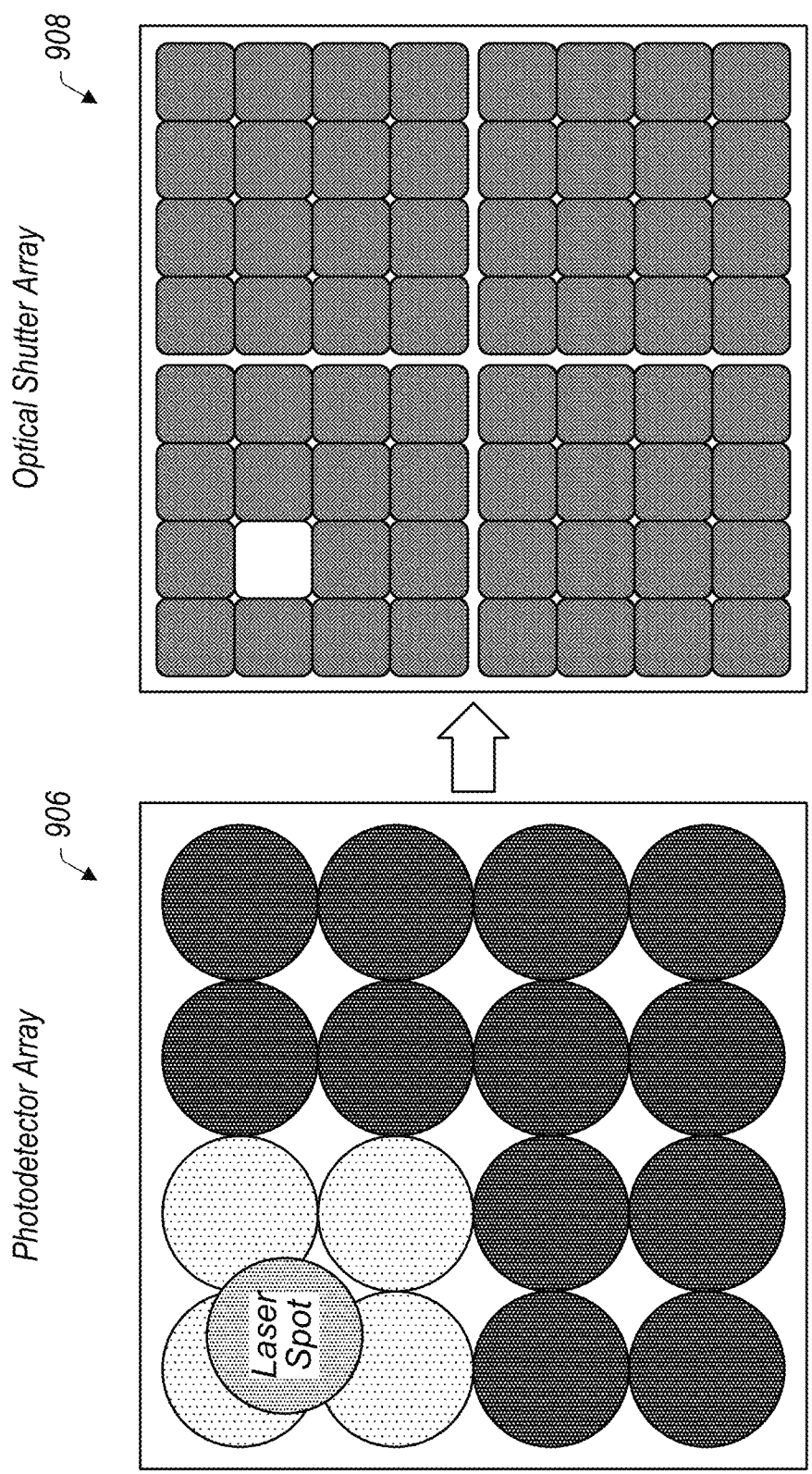
FIG. 9B illustrates four-to-one mapping between a photodetector array and an optical shutter array according to some embodiments.

In Path 1, the array of photodetectors in conjunction with a system of lenses or mirrors is used to detect a light pulse from the LiDAR UUT. The location on the photodetector array (pixel) corresponds to the vertical and horizontal scanning angle (φ, θ). This information is used to open a corresponding element in an optical shutter array 806 as illustrated in FIGS. 9A and 9B. The photodetector array and the optical shutter array can have a one-to-one mapping as shown in FIG. 9A or a different mapping scheme as illustrated in FIG. 9B. The photodetector array determines which of its detectors has a light pulse. There is a mapping from the photodetector array to the optical shutter array. This may be a one-to-one mapping, such as in FIG. 9A, or other possible mapping schemes may be used, such as shown in FIG. 9B, which illustrates a 1:4 mapping. As shown in FIG. 9B, the proportion of light in each of the 4 elements in the top left quadrant of the photodetector array may be used to identify the center of the laser spot for the optical shutter array. Other mappings are also possible. Each photodetector in the array has a corresponding pulse generator. The rising edge from the photodetector triggers the pulse. This pulse may be fed to a LiDAR image generator as a timing reference.

Path 2 may comprise an optical processing chain. As shown, light pulses from the optical signal splitter are fed into an optical processing chain comprising a frequency shifter, a selectable optical delay, an amplitude controller, and a LiDAR image generator. The LiDAR image generator may be programmed to assign an amplitude, a Doppler shift and a delay value to each point in the point cloud. The delay value for the point(s) activated in at each scan position is (are) fed to a selectable optical delay. The Doppler shift frequency for the point(s) activated in at each scan position is (are) fed to a RF signal generator feeding an optical IQ modulator. The IQ modulator may create an offset in the optical frequency equal to the desired Doppler shift. An optical PLL can also be used to generate a frequency offset. The amplitude value for the point(s) activated in at each scan position is (are) fed to a selectable gain/attenuation stage. The light signal from each optical processing chain is fed to a lens system that illuminates an optical shutter array 806.

The delayed, Doppler shifted and attenuated signal exits through the open elements in the optical shutter array. A mapping exists between the photodetector array and the optical shutter array. Optical shutter arrays can be reflective (mirrors) or transmissive (lenses).

FIG. 8B illustrates a LiDAR scene emulator system that operates similar in some respects to the system shown in FIG. 8A. However, in the system shown in FIG. 8B, a lens system 854 is used to both receive the light from the LiDAR UUT and output the processed light back to the LiDAR UUT (rather than using a separate optical shutter array or MEMS mirror array for output as in FIG. 8A). As illustrated in FIG. 8B, an application specific device such as the illustrated off-axis parabolic mirror 852 may be used to direct the light from the LiDAR UUT onto a lens system 854. The lens system 854 focuses different points of light received from the LiDAR UUT onto different optical fibers (or optical circulators) 855. A beam splitter is also utilized to split the received light into Path 1 and Path 2, as in FIG. 8A. The light on Path 2 is fed to a scan detection system 874. Scanning information may (optionally) be received from the LiDAR UUT. The received light and/or the scanning information is then utilized by an amplitude controller 870, and optical attenuator 866, an optical amplifier 868, a LiDAR image generator 864, and/or an RF signal generator 862 to determine the parameters of the optical modulator 858 and selectable optical delay 860 to modify the light on Path 1 to emulate the over-the-air environment. Subsequent to processing the received light by an optical modulator 858 and a selectable optical delay 860 in each of the optical fibers, the processed light is returned to the optical fibers for transmission back through the lens system and to the LiDAR UUT.

Another embodiment relates to a point cloud emulator for scanned, pulsed ToF LiDAR Systems. Pulsed ToF systems do not directly respond to Doppler shifts. In the systems of FIGS. 8A-B, the frequency shifter block may be unnecessary and may be removed. The LiDAR image generator block may be agile and accurate enough to change delay from point-to-point and from frame-to-frame in a way that accurately reflects the desired target velocity.

Figure 10:
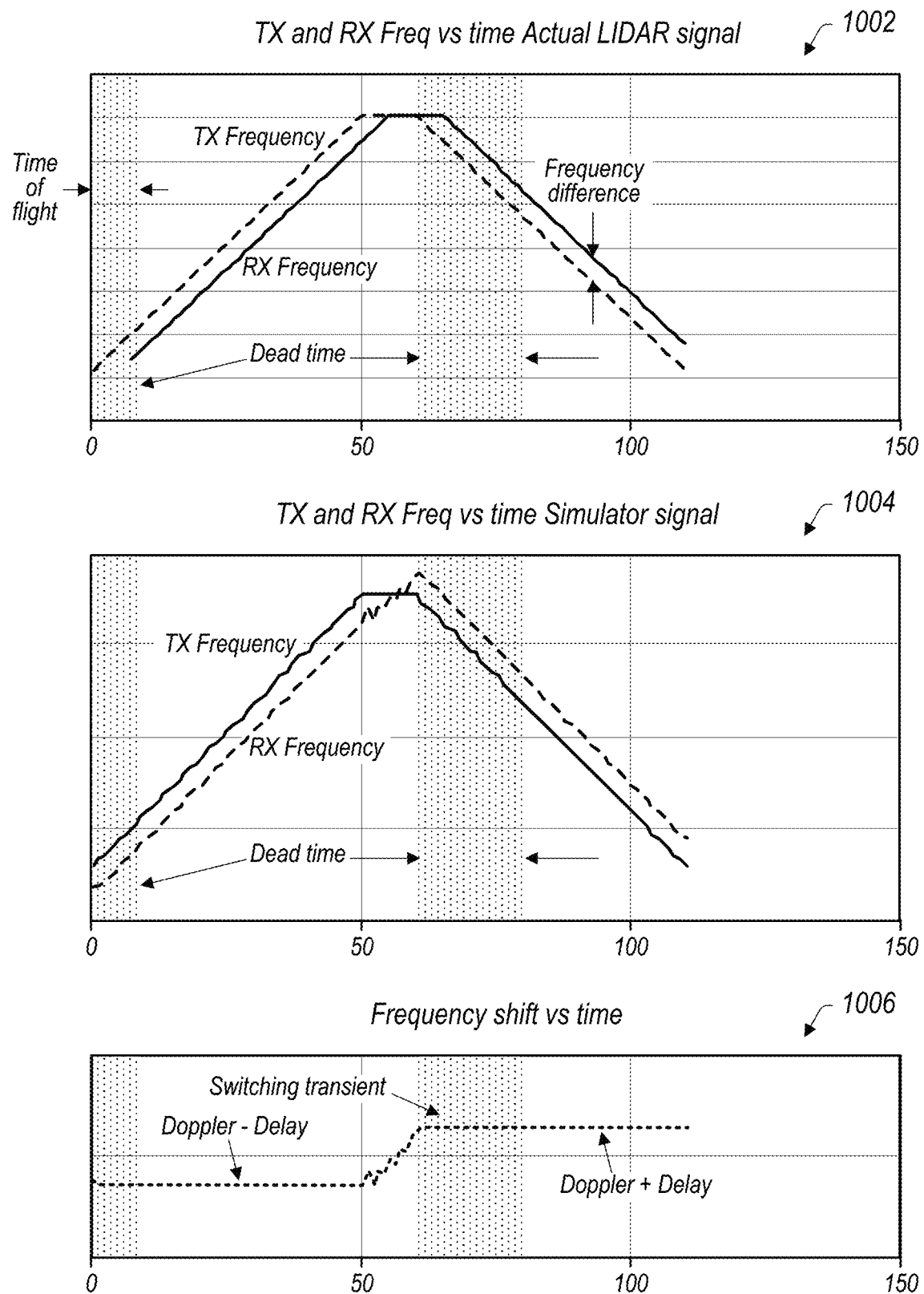
FIG. 10 illustrates using frequency shift used to emulate both delay and Doppler shift in a FMCW LiDAR, according to some embodiments.

Another embodiment relates to a point cloud emulator for scanned FMCW LiDAR Systems. FMCW LiDARs experience both path delay and Doppler shifts as a frequency shift. In some embodiments, the selectable delay apparatus from the diagrams in FIGS. 8A-B may be removed, and both path delay and Doppler shift may be emulated by the IQ frequency modulator. This may operate in a dual slope FMCW LiDAR system as follows. The RF signal generator in FIG. 7 may be designed to be able to change frequency quickly as the FMCW slope changes from positive to negative as shown in FIG. 10. During the up-slope, the RF Signal Generator may be programmed to produce a frequency that has the Doppler component minus the delay component. During the down-slope the RF Signal Generator may be programmed to produce a frequency that has the Doppler component plus the delay component. There may be a switching transient in the signal generator. This transient is ignored as long as it happens during the short time when the LiDAR switches from up-slope to down-slope processing. This dead time may be at least the round-trip delay for the light pulses, and may be approximately 6 ns per meter of distance. This dead time may allow for the frequency to be changed.

Flash LiDAR Scene Emulation

In some embodiments, a LiDAR scene emulator system is described specifically for flash LiDAR, both for single-beam flash LiDAR and multi-beam flash LiDAR. These methodologies may allow for LiDAR test, emulation, and calibration, for both the full field of view of the LiDAR and/or a subset of view for the LiDAR. These methodologies may operate in real-time with the same frame rate of the flash LiDAR sensor, which enables data playback and Hardware-in-the-Loop ("HiL") test types.

Figure 11:
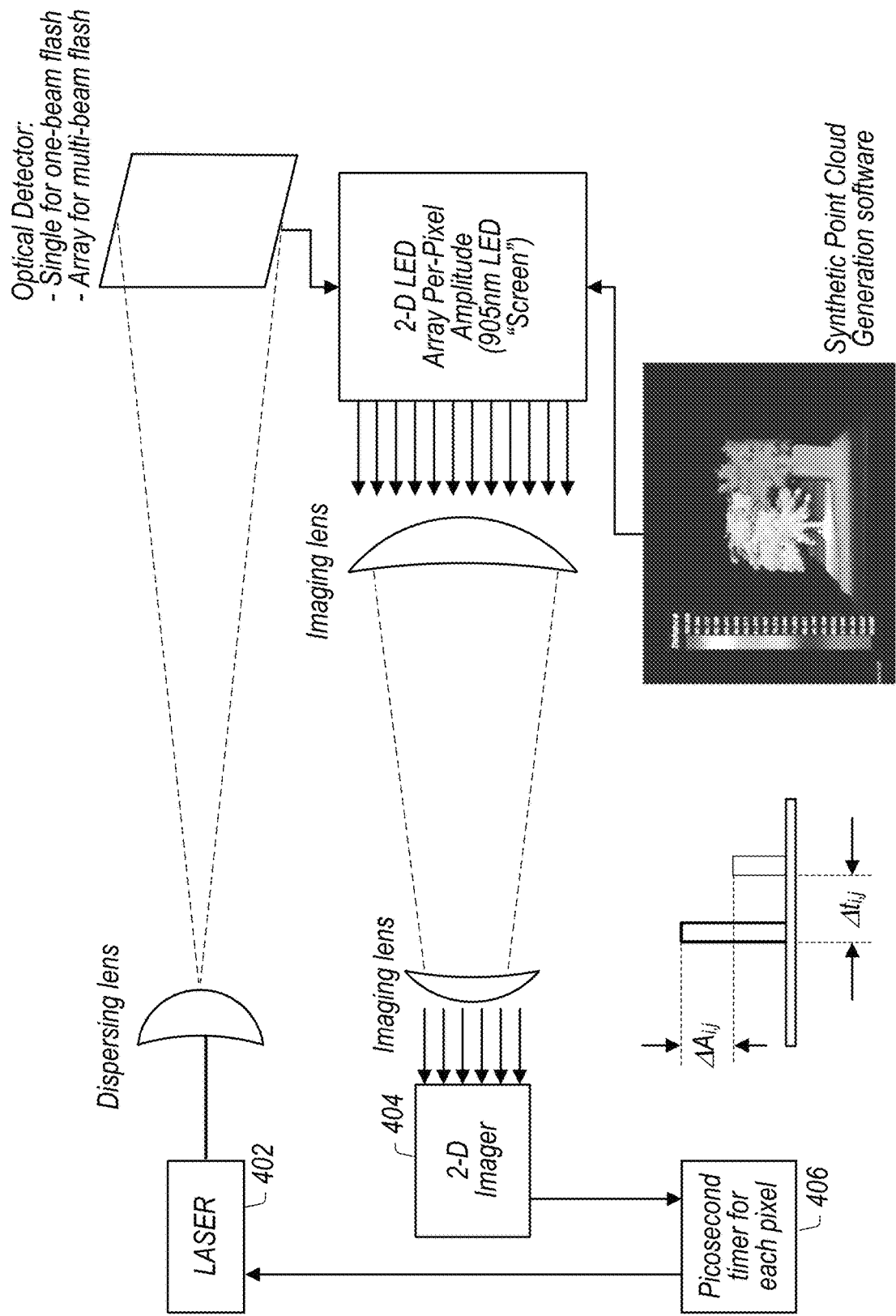
FIG. 11 illustrates a schematic diagram of a flash LiDAR scene emulator, according to some embodiments.

FIG. 11 illustrates a method for emulating a LiDAR scene for both single-beam and multi-beam flash LiDAR types. The illustrated method may emulate the entirety of the field of view of a LiDAR system simultaneously. The methodology utilizes an optical detector placed in front of a flash LiDAR device. When the LiDAR device outputs it "flash" of light, the detector indicates to the processor of the emulator system when this happens. For single-beam flash LiDAR, only one optical detector is utilized to detect the LiDAR flash. For multi-beam flash LiDAR, multiple optical detectors may be used, one for each of the beams of the LiDAR device. For any LiDARs developed in the future that might use scanned or multibeam flash LiDAR with one or multiple beams, a detector that is purpose built to detect which pixels are illuminated may be used.

In software, a synthetic point cloud may be created that will be the basis of what is to be generated back to the LiDAR device once the flash(es) of LiDAR occurs. This synthetic point cloud may include range and intensity per point of the point cloud. Those range and intensity values are converted to timing and optical intensity values to that may then be sent back to the emulator for transmission to the LiDAR device once the LiDAR flash(es) occur.

There are two proposed methodologies for accurately generating the point cloud back to the LiDAR system, illustrated in FIGS. 12 and 13 and described below.

Figure 12:
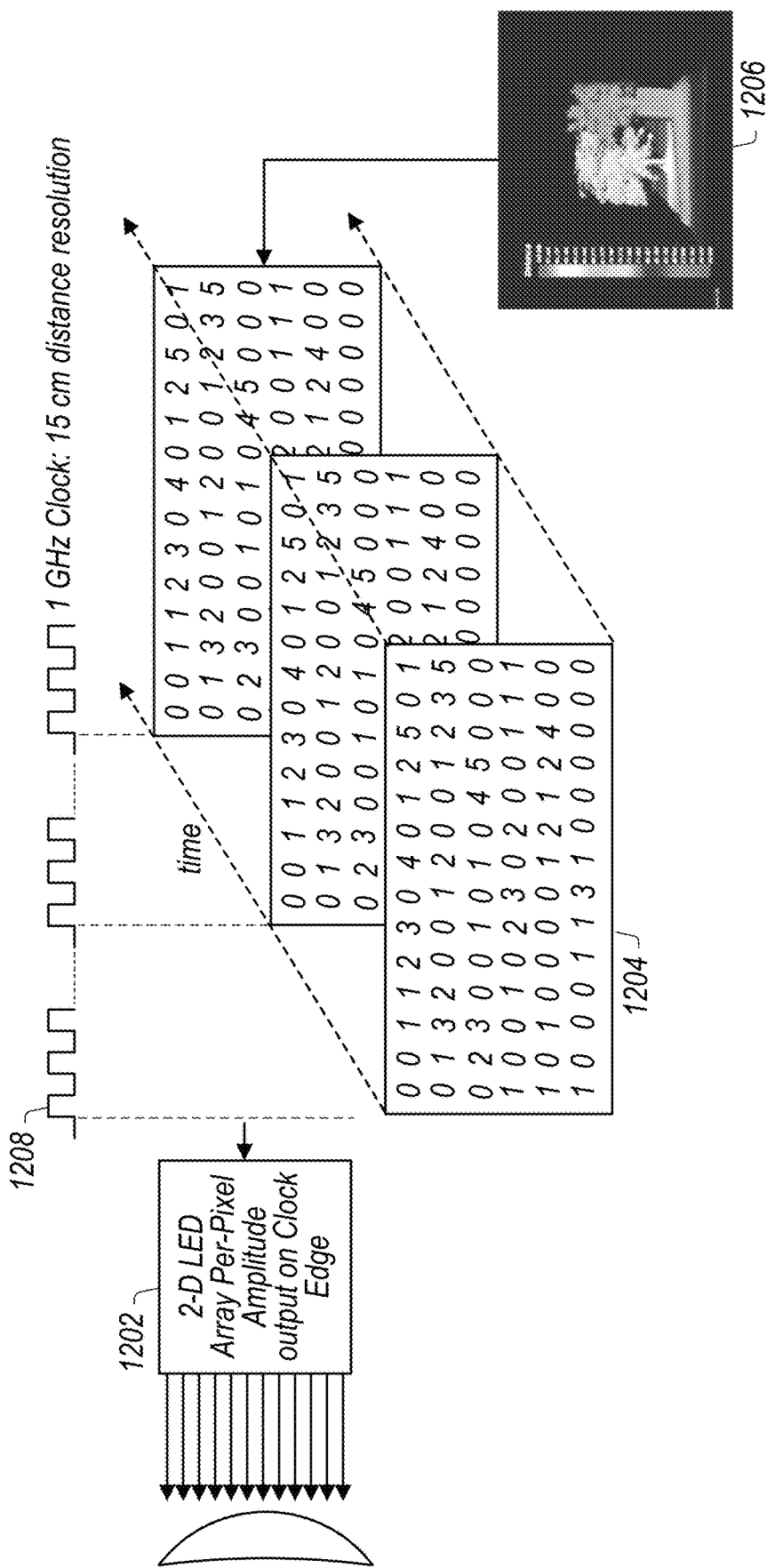
FIG. 12 illustrates a method for utilizing a sequence of 2D matrices to emulate a flash LiDAR over-the-air scene, according to some embodiments.

FIG. 12 shows a methodology for generating an emulated Flash Point Cloud. This methodology creates a clock with a data rate that corresponds to a specific distance resolution. For example, a 1 GHz clock corresponds to a 15 cm distance resolution (e.g., light travels roughly 30 cm through air in 1 nanosecond, the round trip distance, which corresponds to a 15 cm one-way distance resolution). The clock breaks the point cloud delays into 15 cm "slices in time and space" and updates a 2D array with intensity values for each specific instance in time and space. It then populates the next 2D array with the following slice of time and space, one clock cycle later. Said another way, point cloud software generates a series of matrices, where each matrix describes the array of light intensities to be transmitted back to the LiDAR device at a particular moment in time. Each matrix encodes the light intensities of the emulated scene at a particular emulated distance from the LiDAR device. For a 1 GHz clock, the matrices will instruct a 2D LED array to transmit light back to the LiDAR device with a delay between transmissions of 1 nanosecond, and this delay will emulate progressively larger round-trip delays for subsequent LED transmissions. This builds a 3D array of intensities with a small distance resolution (15 cm for a 1 GHz clock). Notably, the array will often have mostly empty elements, since there are very few optical returns compared to the distance and timing resolution created by the array. The system outputs this array responsive to receiving a detection from the optical detector. Timing for outputting the array is calibrated so that the round trip distance of the LiDAR device's output and input is identical to what it would expect in the "real world," which means there is a minimum distance that the system is capable of emulating.

The optical output of the emulator system is transmitted through a densely packed 2D LED or optical diode, e.g., similar to an OLED screen. Each element of the optical array may be driven at the same clock rate as chosen previously. The 2D LED array may operate in the appropriate optical spectrum for the specific LiDAR sensor, such as 905 nm. Each element of the 2D LED array has variable amplitude control, and the amplitude of each pixel for each successive output is determined by corresponding values of the elements of the 2D matrices received from the point cloud software. These embodiments may utilize large amounts of memory space and fairly complex electrical design, but advantageously utilize relatively simple optical design.

Figure 13:
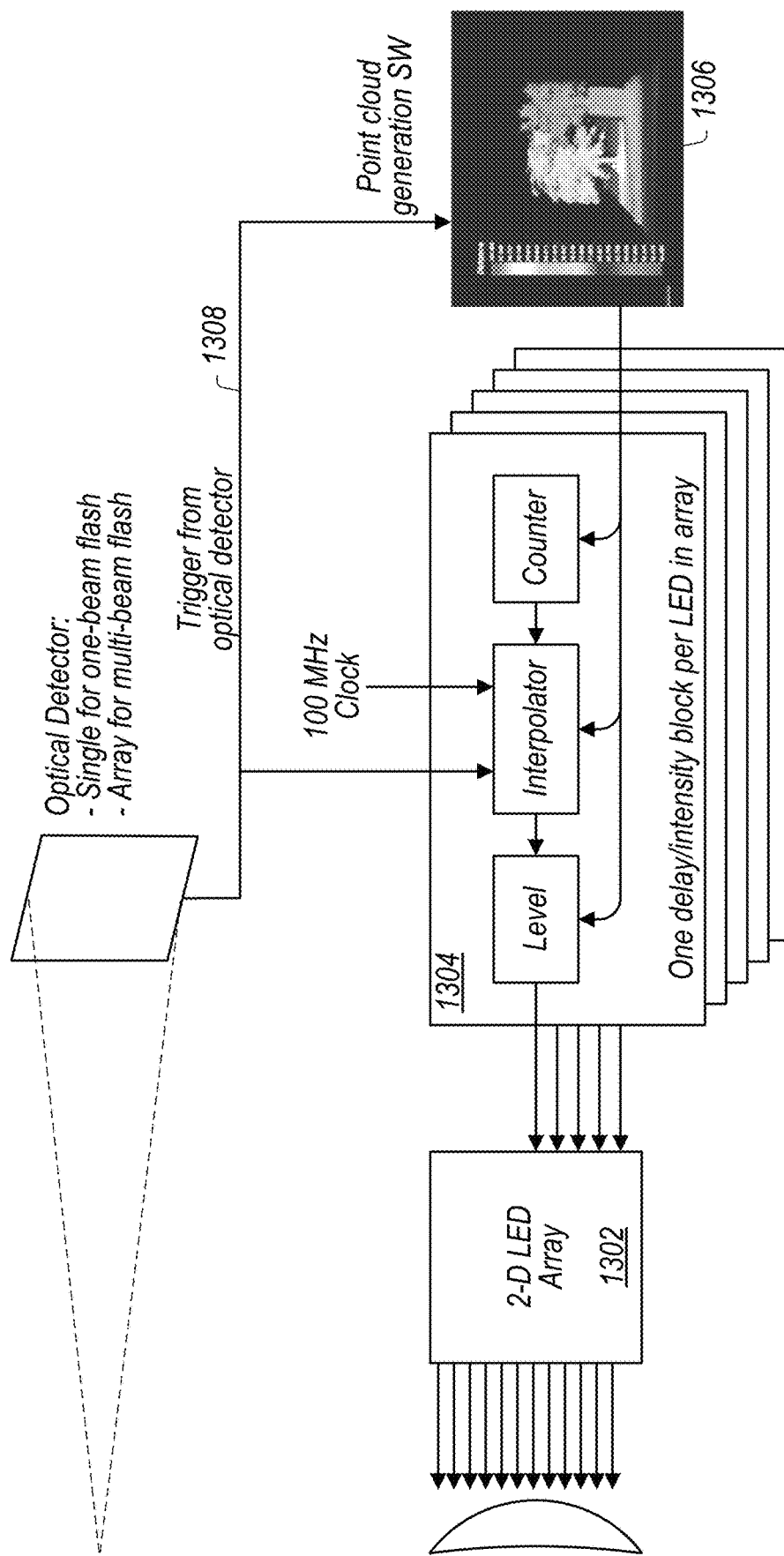
FIG. 13 illustrates an method for generating an emulated scene for flash LiDAR using dedicated timing elements, according to some embodiments.

FIG. 13 illustrates an alternative methodology for generating an emulated scene for flash LiDAR, according to some embodiments. This is similar to the methodology described in conjunction with FIG. 12 in that it takes the software output from the emulation software as a series of delays and intensities. Where this differs is that each element of the 2D LED optical array has its own dedicated timing element, as opposed to utilizing a global 1 GHz clock. Advantageously, this eliminates the need for creating an array with mostly empty elements. Further, the system shown in FIG. 13 may effectively operate with a slower (and less expensive) 100 MHz clock, rather than the 1 GHz clock used in the system shown in FIG. 12. Rather, each pixel has a dedicated module that transmits instructions to the respective pixel to output light at a specified intensity. However, the embodiment described in FIG. 13 utilizes more electrical and optical complexity than that described in FIG. 12, since one delay generator and one optical amplifier is utilized per optical element of the 2D array.

Figure 14:
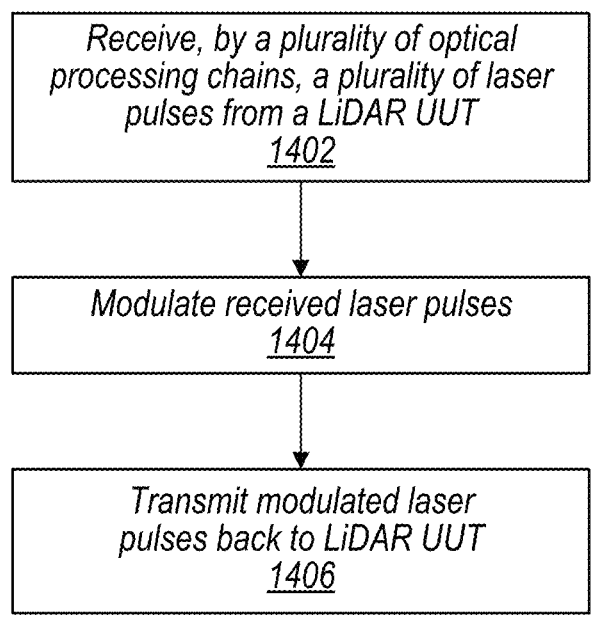
FIG. 14 is a flowchart diagram illustrating a method for an emulator system to emulate an over-the-air environment for testing a ToF and/or FMCW LiDAR UUT, according to various embodiments.

FIG. 14—Flowchart for ToF/FMCW LiDAR Environment Emulation

FIG. 14 is a flowchart diagram illustrating a method for an emulator system to emulate an over-the-air environment for testing a ToF and/or FMCW LiDAR UUT, according to various embodiments. The emulator system may include a lens system and a plurality of optical processing chains. The emulator system may further include a processor coupled to a non-transitory memory medium wherein the processor is configured to direct operation of the emulator system. In some embodiments, the described methods and systems may be specifically tailored to operate with ToF LiDAR UUTs. Alternatively, the described methods and systems may be specifically tailored to operate with FMCW LiDAR UUTs, or they may be adapted such that a single emulator system may operate with both ToF and FMCW LiDAR UUTs.

Aspects of the method of FIG. 14 may be implemented by an emulator system, e.g., such as those illustrated in and described with respect to various of the Figures herein, or more generally in conjunction with any of the computer circuitry, systems, devices, elements, or components shown in the above Figures, among others, as desired. For example, a processor (and/or other hardware) of such a device may be configured to cause the device to perform any combination of the illustrated method elements and/or other method elements.

Note that while at least some elements of the method of FIG. 14 are described in a manner relating to the use of techniques and/or features associated with specific LiDAR methodologies, such description is not intended to be limiting to the disclosure, and aspects of the method of FIG. 14 may be used in any suitable LiDAR system, as desired. In various embodiments, some of the elements of the methods shown may be performed concurrently, in a different order than shown, may be substituted for by other method elements, or may be omitted. Additional method elements may also be performed as desired. As shown, the method of FIG. 14 may operate as follows.

At 1402, a plurality of optical processing chains receives a plurality of laser pulses from one or more lasers of the LiDAR UUT. Each optical processing chain includes an optical fiber configured to receive a distinct subset of the plurality of laser pulses. In some embodiments, each distinct subset of the plurality of laser pulses includes laser pulses from a distinct laser of the LiDAR UUT, and each laser of the LiDAR UUT sweeps over a distinct portion of the field of view of the LiDAR UUT. In some embodiments, each laser of the plurality of lasers sweeps over a single line of the field of view of the LiDAR UUT, and the lens system is configured to focus light received along each line into respective points. For example, each laser may sweep horizontally in a line, and the lens system may focus each line into a point for reception by a respective optical fiber. Accordingly, each optical fiber may receive a disjoint set of laser pulses from respective lasers of the LiDAR UUT.

At 1404, the received laser pulses are modulated by each of the plurality of optical processing chains. Modulating the received laser pulses may include implementing one or more of in-phase quadrature (IQ) frequency modulation, optical time delays, and/or optical amplitude modulation. IQ frequency modulation may involve frequency-shifting or translating the received laser pulses. Implementing IQ frequency translation may be used to emulate Doppler shift and/or time delays for FMCW LiDAR UUTs. Implementing optical time delays may be used to emulate a time-of-flight to objects in the emulated over-the-air environment for ToF LiDAR UUTs. Implementing optical amplitude modulation may include selectively attenuating and/or amplifying the received laser pulses to emulate reflectivity and path loss at locations being emulated in the over-the-air environment. The optical amplitude modulators may include separate optical attenuator and amplifier devices, or they may be combined into a single attenuator/amplifier device for each optical chain. Modulating the received laser pulses is performed to emulate the over-the-air environment. Modulating the received laser pulses may be performed optically to maintain coherence between the received laser pulses and the modulated laser pulses that are transmitted back to the LiDAR UUT. The plurality of optical processing chains may concurrently modulate their respective received laser pulses.

In some embodiments, the emulator system is customized to operate specifically with ToF LiDAR UUTs. In these embodiments, the optical processing chains may include optical time delays and optical amplitude modulators, but they may exclude the IQ frequency modulators since ToF LiDAR does not utilize frequency shift information. Alternatively, in other embodiments the emulator system may be customized to operate specifically with FMCW LiDAR UUTs. In these embodiments, the optical processing chains may include IQ frequency modulators and optical amplitude modulators, but they may exclude the optical time delays. For these embodiments, the IQ frequency translators may be utilized to emulate both Doppler shift and time delay, such that a separate time delay apparatus is not necessary. For example, for FMCW LiDAR, the plurality of laser pulses each include a linear frequency up-sweep followed by a linear frequency down-sweep. Implementing the IQ frequency modulation may involve shifting the linear frequency up-sweep in a same direction as the linear frequency down-sweep to emulate a Doppler shift in the over-the-air environment and shifting the linear frequency up-sweep in an opposite direction as the linear frequency down-sweep to emulate a time delay in the over-the-air environment.

Alternatively, in some embodiments, the emulator system may include all three of the IQ frequency modulators, the optical time delays, and the optical amplitude modulators in each of the optical processing chains. In these embodiments, the emulator system may be programmatically controlled to emulate over-the-air environments for both ToF and FMCW LiDAR UUTs. For example, the emulator system may not activate the IQ frequency modulators when performing emulation for a ToF LiDAR UUT, and it may not activate the optical time delays when performing emulation for an FMCW LiDAR UUT.

In some embodiments, the emulator system receives frequency modulation values, time delay values, and/or amplitude modulation values from a LiDAR image generator for each point in a point cloud of the over-the-air environment. The LiDAR image generator may be a software program stored on the non-transitory memory medium that is executable by the processor. The LiDAR image generator may be user programmable to produce time delay values and amplitude modulation values corresponding to different over-the-air environments. In these embodiments, implementing IQ frequency modulation, optical time delays, and/or optical amplitude modulation is performed based on the frequency modulation values, time delay values, and/or the amplitude modulation values, respectively.

At 1406, the modulated laser pulses are transmitted to the LiDAR UUT. The modulated laser pulses may be transmitted to the LiDAR UUT through the same lens system used to receive the laser pulses from the LiDAR UUT, or they may be transmitted through a separate dedicated output lens system. For example, each of the optical fibers may be configured to transmit the modulated laser light back through the lens system, for reception by the LiDAR UUT. The LiDAR UUT may then reproduce a LiDAR image based on the received modulated laser light.

Figure 15:
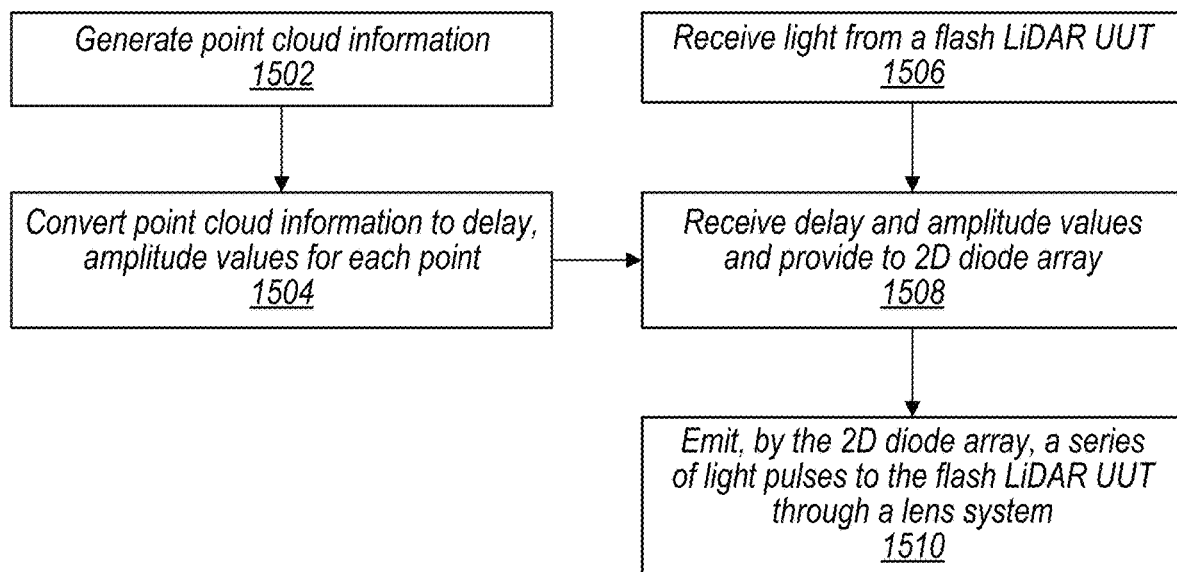
FIG. 15 is a flowchart diagram illustrating a method for emulating an over-the-air environment for a flash LiDAR UUT, according to some embodiments.

FIG. 15—Flowchart for Flash LiDAR Environment Emulator

FIG. 15 is a flowchart diagram illustrating a method for emulating an over-the-air environment for a flash LiDAR UUT, according to some embodiments. The emulator system may include a processor coupled to a non-transitory memory medium, where the processor is configured to direct operation of the emulator system. The emulator system may further include one or more optical detectors and a 2D diode array or another type of 2D light-emitting array. While embodiments herein describe an emulator system that utilizes a diode or LED array, it may be understood that any other type of 2D light-emitting array may also be used and is within the scope of some embodiments. In some embodiments, the described methods and systems may be specifically tailored to operate with flash LiDAR UUTs.

Aspects of the method of FIG. 15 may be implemented by an emulator system, e.g., such as those illustrated in and described with respect to various of the Figures herein, or more generally in conjunction with any of the computer circuitry, systems, devices, elements, or components shown in the above Figures, among others, as desired. For example, a processor (and/or other hardware) of such a device may be configured to cause the device to perform any combination of the illustrated method elements and/or other method elements.

Note that while at least some elements of the method of FIG. 15 are described in a manner relating to the use of techniques and/or features associated with specific LiDAR methodologies, such description is not intended to be limiting to the disclosure, and aspects of the method of FIG. 15 may be used in any suitable LiDAR system, as desired. In various embodiments, some of the elements of the methods shown may be performed concurrently, in a different order than shown, may be substituted for by other method elements, or may be omitted. Additional method elements may also be performed as desired. As shown, the method of FIG. 15 may operate as follows.

At 1506, one or more optical detectors receive light from the flash LiDAR UUT.

In some embodiments, the flash LiDAR UUT is a multi-flash LiDAR device including multiple lasers producing multiple respective flashes, where each laser flashes light in a different sub-region of the field of view (FoV) of the flash LiDAR UUT. In these embodiments, the emulator system may include a plurality of optical detectors, where each optical detector of the plurality of optical detectors is configured to receive a flash from a different laser of the multi-flash LiDAR UUT.

At 1502, a processor coupled to a non-transitory computer-readable memory medium generates point cloud information. The point cloud information may be generated based on an image of a scene to be emulated, or based on a video including a sequence of frames of a scene to be emulated. The image or sequence of images may be converted to point cloud information, where the point cloud information includes a distance, reflectivity, and/or velocity value for each of a plurality of angular positions (i.e., for a set of angles ($\theta$, $\varphi$) spanning the field of view of the image at a particular resolution).

At 1504, the point cloud information is converted to delay and amplitude values for each point in a 2D array. In some embodiments, as shown in FIG. 12, the delay and amplitude values are encoded as a plurality of matrices corresponding to the emulated over-the-air environment, where each matrix of the plurality of matrices corresponds to a different emulated time delay, and each entry in each matrix of the plurality of matrices specifies an amplitude of a pixel of a two-dimensional (2D) light-emitting diode (LED) array. For example, each matrix may present an intensity map for the pixels of the 2D LED array. Alternatively, in other embodiments the delay and amplitude values are encoded as an emulated flash point cloud that specifies an intensity and/or delay for each pixel of the 2D LED array, as shown in FIG. 13.

In some embodiments, the non-transitory computer-readable memory medium has stored thereon point cloud information that is generated in software that is user programmable to configure the emulated over-the-air environment. The emulated over-the-air environment may specify a location (e.g., x, y and z coordinates) and a reflectivity for each point in a point cloud, and generating the point cloud information may be performed by the point cloud software based on the location and reflectivity of each point in the point cloud.

In some embodiments, software may be executed to determine the appropriate delay and amplitude values for each point in the field of view that corresponds to the point cloud information of the emulated over-the-air environment. In some embodiments, the delay and amplitude values are stored as a series of 2D matrices, where the entries in the matrix correspond to the amplitude of light at different points in the field of view, and the different matrices each correspond to a different time delay. In these embodiments, as described below, the series of matrices may be sequentially provided to the 2D light-emitting array to cause the light-emitting array to sequentially emit light according to the amplitude values and the time delays.

Alternatively, the delay and amplitude values may be organized according to their respective pixels, i.e., each pixel may have a corresponding delay and amplitude value, and these may be provided to separate timing elements for each pixel, to cause the pixels to emit light according to their respective delay and amplitude values. These embodiments have the advantage of utilizing a smaller data footprint for the delay and amplitude values compared to the embodiment that utilizes sequential matrices as described above. For example, representing the delay and amplitude values as a series of matrices will typically introduce a large number of null entries. However, an advantage of the sequential matrix representation is that a single timing element is used for the 2D diode array, rather than assigning a separate timing element for each pixel.

At 1508, delay and amplitude values are received by the emulator system. The emulator system may provide signaling to the 2D diode array causing the array to emit light according to the delay and amplitude values. The 2D diode array may be a light emitting diode (LED) array, or another type of light-emitting array for controllably emitting a plurality of beams of light. For an emulator system configured to emulate an environment for a multi-flash LiDAR UUT, portions of the converted point cloud information may be separately provided to the 2D diode array responsive to receiving each flash of the plurality of flashes. For example, each received flash may trigger the processor to provide point cloud information corresponding to the sub-region of the FoV illuminated by the received flash.

In some embodiments, providing the point cloud information includes sequentially providing, by the processor, matrices of the plurality of matrices to the 2D diode array. In some embodiments, the matrices of the plurality of matrices are provided to the 2D diode array periodically with a predetermined periodicity, where the 2D diode array emits light to the flash LiDAR UUT with the predetermined periodicity, and where the predetermined periodicity corresponds to a depth resolution of the emulated over-the-air environment (see, e.g., FIG. 12). Each matrix received by the 2D diode array may trigger the diode array to emit light according to the intensities specified by the matrix, as described below.

Alternatively, in some embodiments, the processor is coupled to a plurality of timing elements and each timing element is coupled to a pixel of the 2D diode array. In these embodiments, the processor may send, to each timing element, intensity and timing information for the specific pixel coupled to the respective timing element (see, e.g., FIG. 13). The timing elements may then transmit the intensity information to its coupled pixel according to the timing information. For example, each timing element may separately instruct its coupled pixel to emit a sequence of pulses according to the intensity and timing information.

In some embodiments, timing for providing the point cloud information to the 2D diode array is selected to emulate a round trip time of the emulated over-the-air environment.

In some embodiments, a synchronization clock may be used to synchronize the one or more optical devices receiving the light from the flash LiDAR UUT with the processor providing the matrices of the plurality of matrices to the 2D diode array.

At 1510, responsive to receiving the delay and amplitude values, the 2D diode array emits a series of light pulses to the flash LiDAR UUT through a lens system. For example, when the point cloud information is a series of matrices, each matrix may trigger the 2D diode array to emit light according to the intensity pattern indicated by the matrix. The 2D diode array may receive a sequence of matrices, and may sequentially emit light according to the indicated patterns. Alternatively, the delay and amplitude values may be directly provided to a plurality of timing elements that are each coupled to a different pixel of the 2D diode array, and the timing elements may utilize the delay and amplitude values corresponding to their respective pixels to cause the pixels to emit light according to the delay and amplitude values. The light emitted by the 2D diode array emulates light that would be emitted by the emulated over-the-air environment responsive to receiving the light from the flash LiDAR UUT. The flash LiDAR may use the light received from the 2D diode array to produce a LiDAR image, for testing or other purposes.

Additional Embodiments

The following are examples of additional aspects of the described embodiments:

FIG. 6 illustrates a parallel point cloud emulator that is generic enough to work for all LiDAR types, including TOF, FMCW and Flash. The parallel point cloud emulator may include a high level of integration and, while expensive, may become more economically viable in the future.

The point cloud emulators for scanned, pulsed systems shown in FIGS. 8A-B may work for FMCW as well as TOF. This point cloud emulator may use an optical shutter array. Other advantageous aspects of the system include coupling a photodetector array to an optical shutter array mapping the photodetector array to the optical shutters in various ways.

The optical IQ modulator may be removed from the parallel point cloud emulators shown in FIGS. 8A-B for exclusive use in TOF LiDAR systems.

An optical IQ modulator and/or an electro-optical PLL (EOPLL) may be used for frequency shifts in various embodiments.

A different frequency shift may be used for the up-slope and the down-slope of a linear-shift frequency pulse to emulate both distance and Doppler shift. This enables the removal of the delay generator from the parallel point cloud emulators shown in FIGS. 8A-B, to reduce costs for FMCW LiDAR system scene emulation.

One embodiment relates to a method for generating a point cloud. The method for generating a point cloud may receive a description of a scene in the form of a list of points and descriptors, photographs, video files and or mathematical formulas and may generate the information for a point cloud. The information for a point cloud may include: Vertical angle, Horizontal angle, Distance, Velocity, and Reflectivity for each point in the point cloud. The method for generating a point cloud allows for the introduction of LiDAR impairments such as dust, snow, rain, sunlight, light from other LIDARs, etc.

Another embodiment relates to a method for translating the point cloud into an array of vertical and horizontal angles, distance, reflectivity, and Doppler shift. The method for translating point clouds into LiDAR parameters may include representing: 1) Speed as the appropriate amount of Doppler shift for the light wavelength used; 2) Distance as the appropriate amount of delay; 3) Reflectivity as the appropriate amount of gain or attenuation for any given distance; and 4) Vertical and horizontal angles as the position on a grid of light emitters or light shutters.

Therefore, these embodiments may be operable to translate the elements of a scene into hardware parameters that can be used to emulate the scene. These hardware parameters may then be used in the LiDAR emulator described herein to emulate the scene.

Another embodiment relates to a combined system configured to perform LiDAR scene emulation and laser measurements. For example, the systems described herein may further include a delay line discriminator, optical phase-locked loop (PLL), optical demodulator, etc. to measure chirp linearity. Another embodiment relates to a method for measuring laser line width (the optical equivalent of jitter or phase noise), optical power measurements, or pulse width measurements, among other possibilities. Examples of this method include use of an optical PLL, a delay line discriminator, an optical spectrum analyzer. In these embodiments, the same emulator system used to emulate an over-the-air environment may also be configured to perform these measurements on light received from a LiDAR system. In other words, a single system may be configured to perform the dual purposes of both LiDAR scene emulation and LiDAR light measurement. Some components of the system may be shared and used for both scene emulation and light measurement, such as the lens system, optical fibers, and/or one or more interfaces used to power, control, and receive data from the LiDAR unit. The system may further include additional components for performing light measurements. Chirp linearity and laser line width may be used in assessing whether the received light is an appropriate candidate for LiDAR emulation as described herein.

In some embodiments, a system is described for emulating an over-the-air environment for testing a light detection and ranging (LiDAR) unit under test. The system comprises a lens system configured to receive light from the LiDAR unit under test, and a plurality of optical processing chains coupled to the lens system. Each of the optical processing chains comprises at least one optical fiber coupled to the input lens system and configured to provide optical signals corresponding to the received light; a frequency shift emulator coupled to the plurality of optical fibers, wherein the frequency shift emulator is configured to create a frequency offset in the received optical signals; a selectable optical delay device coupled to the frequency shift estimator and configured to selectively delay the optical signals to emulate a round-trip delay of reflected light; and/or at least one optical attenuator/amplifier configured to control the amplitude of the optical signals to emulate different levels of reflectivity, polarization change, and path loss from free space, spectral components of the reflection, and/or diffuse components of the reflection. Each optical processing chain is configured to output the processed optical signals to the LiDAR unit under test through the lens system. Alternatively, in some embodiments each optical processing chain is configured to output the processed optical signals to the LiDAR UUT through an output lens system (different from the lens system used to receive the light from the LiDAR UUT) coupled to each of the optical processing chains and configured to generate light into free space based on the optical signals processed by each optical processing chain.

In various embodiments, the frequency shift emulator comprises an optical IQ modulator or an optical phase-locked loop.

In some embodiments, in each optical processing chain, the at least one optical attenuator/amplifier is configured to selectively attenuate or amplify the optical signal to enable the light intensity output by the system corresponds to reflectivity and path loss at a location on an object being emulated.

In some embodiments, the system is configured to process received light optically to maintain coherence with light received from the LiDAR unit under test.

In some embodiments, the system is configured to process all points in a LiDAR image simultaneously.

In some embodiments, the system further comprises a LiDAR image generator coupled to the frequency shift emulator, the selectable optical delay and the at least one optical attenuator/amplifier. The LiDAR image generator is user programmable to control operation of the frequency shift emulator, the selectable optical delay and the at least one optical attenuator/amplifier.

In some embodiments, the LiDAR image generator is configured to provide a frequency shift value to the frequency shift emulator for use by the frequency shift emulator in creating a frequency offset in the received optical signals.

In some embodiments, the LiDAR image generator is configured to provide a delay value to the selectable optical delay for use by the selectable optical delay to delay the optical signals to emulate a round-trip delay of reflected light In some embodiments, the LiDAR image generator is configured to provide an amplitude value to the at least one optical attenuator/amplifier for use by the optical attenuator/amplifier to control the amplitude of the optical signals to emulate different levels of reflectivity, polarization change, and path loss from free space, spectral components of the reflection, and/or diffuse components of the reflection.

In some embodiments, the LiDAR image generator is configured to provide the frequency shift value, the delay value, and the amplitude value for each point in a point cloud generated by the system.

In some embodiments, the frequency shift emulator is configured to use a different frequency shift for up-slope and down-slope to emulate both distance and Doppler shift.

In some embodiments, a system is described for emulating an over-the-air environment for testing a LiDAR UUT. The system comprises an input lens system configured to receive light from the LiDAR UUT; an input optical splitting block coupled to the input lens system and configured to receive optical signals and provide portions of the optical signals to a first optical processing path and a second optical processing path; and at least one optical shutter array coupled to the first optical processing path and the second optical processing path. Alternatively, in some embodiments the optical shutter array is removed and a lens system is be used to both receive the light from the LiDAR UUT and output the processed light back to the LiDAR UUT. The first optical processing path comprises an array of photodetectors for determining angles of the laser pulse at a particular instant in time, wherein a location of received light on the photodetector array is used to open a corresponding element in the optical shutter array. The second optical processing path comprises an amplitude controller configured to control amplitude of the optical signals to emulate different levels of reflectivity and path loss and a LiDAR image generator coupled to the amplitude controller. The second optical processing path is configured to provide an attenuated signal to the at least one optical shutter array or lens system for exit through one or more open elements in the optical shutter array or through the lens system.

In some embodiments, a location of received light on the photodetector array corresponds to a vertical and horizontal scanning angle ($\phi,\theta$), wherein the vertical and horizontal scanning angle is used to open a corresponding element in the optical shutter array.

In some embodiments, the second optical processing path further comprises a frequency shifter coupled to the selectable optical delay element, wherein the frequency shifter is configured to create a frequency offset in the received optical signals. In some embodiments, the second optical processing path is configured to provide a frequency shifted and attenuated signal to the at least one optical shutter array or lens system for exit through one or more open elements in the optical shutter array or lens system.

In some embodiments, the second optical processing path further comprises a selectable optical delay element coupled to the frequency shifter, wherein the selectable optical delay element is configured to selectively delay the optical signals to emulate a round-trip delay of reflected light. The second optical processing path is configured to provide a delayed and attenuated signal to the at least one optical shutter array or lens system for exit through one or more open elements in the optical shutter array or lens system.

In some embodiments, the second optical processing path further comprises a frequency shifter coupled to the selectable optical delay element, wherein the frequency shifter is configured to create a frequency offset in the received optical signals; and a selectable optical delay element coupled to the frequency shifter, wherein the selectable optical delay element is configured to selectively delay the optical signals to emulate a round-trip delay of reflected light. The second optical processing path is configured to provide a delayed, frequency shifted and attenuated signal to the at least one optical shutter array or lens system for exit through one or more open elements in the optical shutter array or lens system.

In some embodiments, each photodetector in the array of photodetectors has a one-to-one mapping with a corresponding shutter in the optical shutter array.

In some embodiments, each of a plurality of sets of plural photodetectors in the array of photodetectors has a many-to-one mapping with a corresponding shutter in the optical shutter array.

In some embodiments, a system is described for emulating an over-the-air environment for testing a LiDAR UUT. The system comprises an input lens system configured to receive light from the LiDAR UUT, an input optical splitting block coupled to the input lens system and configured to receive optical signals and provide portions of the optical signals to a first optical processing path and a second optical processing path, and at least one optical shutter array coupled to the first optical processing path and the second optical processing path. The first optical processing path comprises an array of photodetectors for determining angles ($\phi,\theta$) of the laser pulse at a particular instant in time, wherein a location of received light on the photodetector array is used to open a corresponding element in the optical shutter array. The second optical processing path comprises a selectable optical delay element coupled to the frequency shifter and configured to selectively delay the optical signals to emulate a round-trip delay of reflected light; an amplitude controller coupled to the selectable optical delay element to control the amplitude of the optical signals to emulate different levels of reflectivity and path loss; and a LiDAR image generator coupled to the selectable optical delay element and the amplitude controller. The second optical processing path is configured to provide a delayed, Doppler shifted and attenuated signal to the at least one optical shutter array for exit through one or more open elements in the optical shutter array.

In some embodiments, a method is described for converting a description of a scene into LiDAR parameters. The method comprises receiving a description of a scene in the form of two or more of points and descriptors, photographs, video files and/or mathematical formulas; and generating the information for a point cloud based on the received description. The information for the point cloud includes vertical angle, horizontal angle, distance, velocity, and reflectivity. The method for generating a point cloud allows for the introduction of LiDAR impairments into an emulation. The method further comprises translating the point cloud into LiDAR parameters, wherein the LiDAR parameters include an array of vertical and horizontal angles, distance, reflectivity, and Doppler shift.

In some embodiments, the method for translating point clouds into LiDAR parameters may include representing: 1) speed as an appropriate amount of Doppler shift for light wavelength used; 2) distance as an appropriate amount of delay; 3) reflectivity as the appropriate amount of gain or attenuation for the at any given distance; and/or 4) vertical and horizontal angles as the position on a grid of light emitters or light shutters.

The following numbered paragraphs describe additional embodiments.

In some embodiments, systems and methods are described for emulating an over-the-air environment for testing a light detection and ranging (LiDAR) unit under test (UUT). The method includes receiving, by a plurality of optical processing chains, a plurality of laser pulses from one or more lasers of the LiDAR UUT, wherein each optical processing chain comprises an optical fiber configured to receive a distinct subset of the plurality of laser pulses; for each of the optical processing chains, modulating the received laser pulses by implementing in-phase quadrature (IQ) frequency modulation, optical time delays, and/or optical amplitude modulation; and transmitting the modulated laser pulses to the LiDAR UUT.

In some embodiments, modulating the received laser pulses is performed to emulate the over-the-air environment.

In some embodiments, the LiDAR UUT comprises a frequency modulated continuous wave (FMCW) LiDAR UUT.

In some embodiments, the plurality of laser pulses comprise a linear frequency up-sweep followed by a linear frequency down-sweep, and implementing the IQ frequency modulation comprises shifting the linear frequency up-sweep in a same direction as the linear frequency down-sweep to emulate a Doppler shift in the over-the-air environment; and shifting the linear frequency up-sweep in an opposite direction as the linear frequency down-sweep to emulate a time delay in the over-the-air environment.

In some embodiments, each distinct subset of the plurality of laser pulses comprises laser pulses from a distinct laser of the LiDAR UUT, wherein each laser of the LiDAR UUT sweeps over a distinct portion of the field of view of the LiDAR UUT.

In some embodiments, implementing optical amplitude modulation comprises selectively attenuating and/or amplifying the received laser pulses to emulate reflectivity and path loss at locations being emulated in the over-the-air environment.

In some embodiments, modulating the received laser pulses is performed optically to maintain coherence between the received laser pulses and the modulated laser pulses.

In some embodiments, the plurality of optical processing chains concurrently modulate their respective received laser pulses.

In some embodiments, the method further comprises receiving frequency modulation values and amplitude modulation values from a LiDAR image generator for each point in a point cloud of the over-the-air environment, wherein said implementing IQ frequency modulation and optical amplitude modulation is performed based on the frequency modulation values and the amplitude modulation values.

In some embodiments, a system for emulating an over-the-air environment for testing a light detection and ranging (LiDAR) unit under test (UUT), the system comprises a lens system configured to receive light from the LiDAR UUT; a plurality of optical processing chains coupled to the lens system, wherein each optical processing chain comprises: an optical fiber coupled to the lens system and configured to receive laser pulses from the LiDAR UUT through the lens system; an in-phase quadrature (IQ) frequency modulator configured to modulate a frequency of the received laser pulses; an optical time delay configured to time delay the received laser pulses; and an optical amplitude modulator configured to modulate an amplitude of the received laser pulses. Each optical processing chain is configured to transmit the frequency shifted, time delayed and amplitude modulated laser pulses to the LiDAR UUT.

In some embodiments, the system is further configured to perform one or more measurements on light received from the LiDAR UUT, wherein the one or more measurements comprise one or more of a laser line width measurement, a chirp linearity measurement, an optical spectrum analyzer measurement, an optical power measurement, and a pulse width measurement.

In some embodiments, the LiDAR UUT comprises a frequency modulated continuous wave (FMCW) LiDAR UUT.

In some embodiments, the received laser pulses comprise a linear frequency up-sweep followed by a linear frequency down-sweep, wherein modulating the frequency of the received laser pulses comprises shifting the linear frequency up-sweep in a same direction as the linear frequency down-sweep to emulate a Doppler shift in the over-the-air environment.

In some embodiments, each optical fiber receives a distinct subset of laser pulses received from a distinct laser of a plurality of lasers of the LiDAR UUT, wherein each laser of the plurality of lasers sweeps over a distinct portion of the field of view of the LiDAR UUT.

In some embodiments, each laser of the plurality of lasers sweeps over a single line of the field of view of the LiDAR UUT, and wherein the lens system is configured to focus light received along each line into respective points.

In some embodiments, modulating the amplitude of the received laser pulses comprises selectively attenuating and/or amplifying the received laser pulses to emulate reflectivity and path loss at a locations being emulated in the over-the-air environment.

In some embodiments, delaying and modulating the frequency and the amplitude and of the received laser pulses is performed optically to maintain coherence between the received laser pulses and the modulated laser pulses.

In some embodiments, the plurality of optical processing chains concurrently modulate their respective received laser pulses.

In some embodiments, the system further comprises a LiDAR image generator coupled to the plurality of optical processing chains, wherein the LiDAR image generator is configured to provide frequency modulation, time delay and amplitude modulation values to the plurality of optical processing chains for each point in a point cloud of the over-the-air environment, wherein the LiDAR image generator is user programmable to produce frequency modulation, time delay and amplitude modulation values corresponding to different over-the-air environments, and wherein delaying and modulating the frequency and amplitude of the received laser pulses is performed based on the frequency modulation, time delay, and amplitude modulation values.

In some embodiments, the frequency shifted, time delayed and amplitude modulated laser pulses are transmitted to the LiDAR UUT through the lens system.

In some embodiments, systems and methods are described for emulating an over-the-air environment for testing a light detection and ranging (LiDAR) unit under test (UUT), the method comprising: receiving, by a plurality of optical processing chains, a plurality of laser pulses from one or more lasers of the LiDAR UUT, wherein each optical processing chain comprises an optical fiber configured to receive a distinct subset of the plurality of laser pulses; for each of the optical processing chains, modulating the received laser pulses by implementing: optical time delays; and optical amplitude modulation; and transmitting the modulated laser pulses to the LiDAR UUT.

In some embodiments, modulating the received laser pulses is performed to emulate the over-the-air environment.

In some embodiments, the LiDAR UUT comprises a time-of-flight (ToF) LiDAR UUT.

In some embodiments, implementing optical time delays emulates a time-of-flight to objects in the emulated over-the-air environment.

In some embodiments, each distinct subset of the plurality of laser pulses comprises laser pulses from a distinct laser of the LiDAR UUT, and each laser of the LiDAR UUT sweeps over a distinct portion of the field of view of the LiDAR UUT.

In some embodiments, implementing optical amplitude modulation comprises selectively attenuating and/or amplifying the received laser pulses to emulate reflectivity and path loss at locations being emulated in the over-the-air environment.

In some embodiments, modulating the received laser pulses is performed optically to maintain coherence between the received laser pulses and the modulated laser pulses.

In some embodiments, the plurality of optical processing chains concurrently modulate their respective received laser pulses.

In some embodiments, the method further includes receiving time delay values and amplitude modulation values from a LiDAR image generator for each point in a point cloud of the over-the-air environment, where said implementing optical time delays and optical amplitude modulation is performed based on the time delay values and the amplitude modulation values.

In some embodiments, the plurality of laser pulses are received from the LiDAR UUT and the modulated laser pulses are transmitted to the LiDAR UUT through a lens system.

In some embodiments, a system for emulating an over-the-air environment for testing a light detection and ranging (LiDAR) unit under test (UUT), includes a lens system configured to receive light from the LiDAR UUT and a plurality of optical processing chains coupled to the lens system. Each optical processing chain includes an optical fiber coupled to the lens system and configured to receive laser pulses from the LiDAR UUT through the lens system, a selectable optical delay device configured to selectively delay the received laser pulses; and an optical amplitude modulator configured to modulate an amplitude of the received laser pulses. Each optical processing chain is configured to transmit the selectively delayed and amplitude modulated laser pulses to the LiDAR UUT.

In some embodiments, the system is further configured to perform one or more measurements on light received from the LiDAR UUT, wherein the one or more measurements comprise one or more of a laser line width measurement, a chirp linearity measurement, an optical spectrum analyzer measurement, an optical power measurement, and a pulse width measurement.

In some embodiments, the LiDAR UUT comprises a time-of-flight (ToF) LiDAR UUT.

In some embodiments, each of the plurality of optical processing chains further comprises an in-phase quadrature (IQ) frequency modulator configured to modulate a frequency of the received laser pulses, wherein the system is configured to emulate the over-the-air environment for either a time-of-flight (ToF) LiDAR UUT or a frequency modulated continuous wave (FMCW) LiDAR UUT, wherein the selectable optical delay devices are utilized to emulate over-the-air environments for ToF LiDAR UUTs, and wherein the IQ frequency modulators are utilized to emulate over-the-air environments for FMCW LiDAR UUTs.

In some embodiments, each optical fiber receives a distinct subset of laser pulses received from a distinct laser of a plurality of lasers of the LiDAR UUT, and each laser of the plurality of lasers sweeps over a distinct portion of the field of view of the LiDAR UUT.

In some embodiments, each laser of the plurality of lasers sweeps over a single line of the field of view of the LiDAR UUT, and the lens system is configured to focus light received along each line into respective points.

In some embodiments, modulating the amplitude of the received laser pulses comprises selectively attenuating and/or amplifying the received laser pulses to emulate reflectivity and path loss at locations being emulated in the over-the-air environment.

In some embodiments, selectively delaying and modulating the amplitude of the received laser pulses is performed optically to maintain coherence between the received laser pulses and the modulated laser pulses.

In some embodiments, the system further includes a LiDAR image generator coupled to the plurality of optical processing chains, wherein the LiDAR image generator is configured to provide time delay values and amplitude modulation values to the plurality of optical processing chains for each point in a point cloud of the over-the-air environment, wherein the LiDAR image generator is user programmable to produce time delay values and amplitude modulation values corresponding to different over-the-air environments, and wherein selectively delaying and modulating the amplitude of the received laser pulses is performed based on the time delay values and the amplitude modulation values.

In some embodiments, the frequency shifted and amplitude modulated laser pulses are transmitted to the LiDAR UUT through the lens system.

Although the embodiments above have been described in considerable detail, numerous variations and modifications will become apparent to those skilled in the art once the above disclosure is fully appreciated. It is intended that the following claims be interpreted to embrace all such variations and modifications.

We claim:

1. A system for emulating an over-the-air environment for testing a flash light detection and ranging (LiDAR) unit under test (UUT), the system comprising:
a processor coupled to a non-transitory computer-readable memory medium;
one or more optical detectors;
a two-dimensional (2D) light-emitting array, wherein the system is configured to:
receive, by the one or more optical detectors, light from the flash LiDAR UUT;
generate, by the processor, a plurality of matrices corresponding to the emulated over-the-air environment, wherein each matrix of the plurality of matrices corresponds to a different emulated time delay, wherein each entry in each matrix of the plurality of matrices specifies an amplitude of a pixel of the 2D light-emitting array;
responsive to receiving the light by the one or more optical detectors, sequentially provide, by the processor, matrices of the plurality of matrices to the 2D light-emitting array, wherein each provided matrix causes the 2D light-emitting array to emit light to the flash LiDAR UUT through a lens according to the specified amplitudes.

2. The system of claim 1,
wherein the light emitted by the 2D light-emitting array emulates light that would be emitted by the emulated over-the-air environment responsive to receiving the light from the flash LiDAR UUT.

3. The system of claim 1,
wherein the flash LiDAR UUT comprises a multi-flash LiDAR device,
wherein the light from the flash LiDAR UUT comprises a plurality of flashes in different regions of a field of view of the flash LiDAR UUT from different respective lasers of the multi-flash LiDAR device, and
wherein the one or more optical detectors comprises a plurality of optical detectors, wherein each optical detector of the plurality of optical detectors is configured to receive a different flash of the plurality of flashes.

4. The system of claim 3,
wherein sequentially providing matrices of the plurality of matrices to the 2D light-emitting array is separately performed responsive to receiving each flash of the plurality of flashes.

5. The system of claim 1,
wherein the matrices of the plurality of matrices are provided to the 2D light-emitting array periodically with a predetermined periodicity, wherein the 2D light-emitting array emits light to the flash LiDAR UUT with the predetermined periodicity, and wherein the predetermined periodicity corresponds to a depth resolution of the emulated over-the-air environment.

6. The system of claim 1, wherein the system is further configured to:
perform one or more measurements on light received from the LiDAR UUT, wherein the one or more measurements comprise one or more of:
a laser line width measurement;
a chirp linearity measurement;
an optical spectrum analyzer measurement;
an optical power measurement; and
a pulse width measurement.

7. The system of claim 1, the system further comprising:
point cloud software stored on the non-transitory computer-readable memory medium, wherein the point cloud software is executable by the processor,
wherein the point cloud software is user programmable to configure the emulated over-the-air environment,
wherein the emulated over-the-air environment comprises a location and a reflectivity for each point in a point cloud, and
wherein the point cloud software is configured to generate the plurality of matrices based on the location and reflectivity of each point in the point cloud.

8. The system of claim 1, the system further comprising:
a synchronization clock configured to synchronize the one or more optical devices receiving the light from the flash LiDAR UUT with the processor providing the matrices of the plurality of matrices to the 2D light-emitting array.

9. A method for emulating an over-the-air environment for testing a flash light detection and ranging (LiDAR) unit under test (UUT), the method comprising:
receiving, by one or more optical detectors, light from the flash LiDAR UUT;
generating, by a processor coupled to a non-transitory computer-readable memory medium, a plurality of matrices corresponding to the emulated over-the-air environment, wherein each matrix of the plurality of matrices corresponds to a different emulated time delay, wherein each entry in each matrix of the plurality of matrices specifies an amplitude of a pixel of a two-dimensional (2D) light-emitting array;
responsive to receiving the light by the one or more optical detectors, sequentially providing, by the processor, matrices of the plurality of matrices to the 2D light-emitting array,
responsive to receiving each matrix of the plurality of matrices, emitting, by the 2D light-emitting array, light to the flash LiDAR UUT through a lens according to the specified amplitudes.

10. The method of claim 9,
wherein the 2D light emitting array comprises a 2D light-emitting diode (LED) array.

11. The method of claim 9,
wherein the flash LiDAR UUT comprises a multi-flash LiDAR device,
wherein the light from the flash LiDAR UUT comprises a plurality of flashes in different regions of a field of view of the flash LiDAR UUT from different respective lasers of the multi-flash LiDAR device, and
wherein the one or more optical detectors comprises a plurality of optical detectors, wherein each optical detector of the plurality of optical detectors receives a different flash of the plurality of flashes.

12. The method of claim 11,
wherein sequentially providing matrices of the plurality of matrices to the 2D light-emitting array is separately performed responsive to receiving each flash of the plurality of flashes.

13. The method of claim 9,
wherein the matrices of the plurality of matrices are provided to the 2D light-emitting array periodically with a predetermined periodicity, wherein the 2D light-emitting array emits light to the flash LiDAR UUT with the predetermined periodicity, and wherein the predetermined periodicity corresponds to a depth resolution of the emulated over-the-air environment.

14. The method of claim 9, the method further comprising:
selecting a timing for providing the matrices to the 2D light-emitting array to emulate a round trip time of the emulated over-the-air environment.

15. The method of claim 9,
wherein the non-transitory computer-readable memory medium has stored thereon point cloud software,
wherein the point cloud software is user programmable to configure the emulated over-the-air environment,
wherein the emulated over-the-air environment comprises a location and a reflectivity for each point in a point cloud, and
wherein generating the plurality of matrices is performed by the point cloud software based on the location and reflectivity of each point in the point cloud.

16. The method of claim 9, the method further comprising:
synchronizing, by a synchronization clock, the one or more optical devices receiving the light from the flash LiDAR UUT with the processor providing the matrices of the plurality of matrices to the 2D light-emitting array.

17. A system for emulating an over-the-air environment for testing a flash light detection and ranging (LiDAR) unit under test (UUT), the system comprising:
a processor coupled to a non-transitory computer-readable memory medium;
one or more optical detectors;
a plurality of timing elements;
a two-dimensional (2D) light-emitting array, wherein each pixel of the 2D light-emitting array is coupled to a different timing element, wherein the system is configured to:
receive, by the one or more optical detectors, light from the flash LiDAR UUT;
generate, by the processor, an emulated flash point cloud, wherein the emulated flash point cloud specifies an intensity of each pixel of the 2D light-emitting array for a plurality of instances in time;
responsive to receiving the light, provide, by the processor, the emulated flash point cloud to the plurality of timing elements; and
by each timing element, trigger the pixel of the 2D light-emitting array coupled to the respective timing element to emit light to the flash LiDAR UUT through a lens according to the specified intensities at each of the plurality of instances in time.

18. The system of claim 17,
wherein the light emitted by the pixels of the 2D light-emitting array emulates light that would be emitted by the emulated over-the-air environment responsive to receiving the light from the flash LiDAR UUT.

19. The system of claim 17,
wherein providing the emulated flash point cloud to the plurality of timing elements comprises providing, to each timing element of the plurality of timing elements, specified intensities and corresponding specified instances in time for the pixel of the 2D light-emitting array coupled to the respective timing element.

20. The system of claim 17,
wherein the flash LiDAR UUT comprises a multi-flash LiDAR device,
wherein the light from the flash LiDAR UUT comprises a plurality of flashes in different regions of a field of view of the flash LiDAR UUT from different respective lasers of the multi-flash LiDAR device,
wherein the one or more optical detectors comprises a plurality of optical detectors, wherein each optical detector of the plurality of optical detectors is configured to receive a different flash of the plurality of flashes, and
wherein providing the emulated flash point cloud to the plurality of timing elements is separately performed responsive to receiving each flash of the plurality of flashes.

* * * * *